US011513686B2

(12) United States Patent
Rangan et al.

(10) Patent No.: US 11,513,686 B2
(45) Date of Patent: Nov. 29, 2022

(54) TECHNIQUES FOR DYNAMICALLY COMPRESSING MEMORY REGIONS HAVING A UNIFORM VALUE

(71) Applicant: NVIDIA Corporation, Santa Clara, CA (US)

(72) Inventors: Ram Rangan, Tamil Nadu (IN); Suryakant Patidar, Karnataka (IN); Praveen Krishnamurthy, Apex, NC (US); Wishwesh Anil Gandhi, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 385 days.

(21) Appl. No.: 16/866,813

(22) Filed: May 5, 2020

(65) Prior Publication Data

US 2021/0349639 A1 Nov. 11, 2021

(51) Int. Cl.
*G06F 3/06* (2006.01)
*H03M 7/30* (2006.01)

(52) U.S. Cl.
CPC .......... *G06F 3/0608* (2013.01); *G06F 3/0659* (2013.01); *G06F 3/0673* (2013.01); *H03M 7/3088* (2013.01)

(58) Field of Classification Search
None
See application file for complete search history.

(56) References Cited

U.S. PATENT DOCUMENTS

| 2011/0087840 | A1* | 4/2011 | Glasco | G06F 12/1009 711/E12.001 |
| 2014/0114938 | A1* | 4/2014 | An | G06F 16/284 707/693 |
| 2016/0378352 | A1* | 12/2016 | Khan | G06F 3/064 711/103 |
| 2019/0034334 | A1* | 1/2019 | Arelakis | H03M 7/40 |

\* cited by examiner

*Primary Examiner* — Charles Rones
*Assistant Examiner* — Jonah C Krieger
(74) *Attorney, Agent, or Firm* — Leydig, Voit & Mayer, Ltd.

(57) ABSTRACT

Accesses between a processor and its external memory is reduced when the processor internally maintains a compressed version of values stored in the external memory. The processor can then refer to the compressed version rather than access the external memory. One compression technique involves maintaining a dictionary on the processor mapping portions of a memory to values. When all of the values of a portion of memory are uniform (e.g., the same), the value is stored in the dictionary for that portion of memory. Thereafter, when the processor needs to access that portion of memory, the value is retrieved from the dictionary rather than from external memory. Techniques are disclosed herein to extend, for example, the capabilities of such dictionary-based compression so that the amount of accesses between the processor and its external memory are further reduced.

19 Claims, 14 Drawing Sheets

TECHNIQUES FOR DYNAMICALLY COMPRESSING MEMORY REGIONS HAVING A UNIFORM VALUE

TECHNICAL FIELD

The present disclosure relates to dictionary-based compression, and more particularly to scalable dictionary-based compression.

BACKGROUND

Conventionally, a zero-bandwidth clear (ZBC) command is used to associate a single value to multiple locations in memory without actually writing the value to each of the memory locations. The association is done by storing the single value (referred to as a uniform value) in a global uniform table at a particular index in the table, and associating the index with the multiple memory locations. Thereafter, when a value needs to be read from one of the multiple memory locations, the value is retrieved from the global uniform table using the index associated with the memory location. The memory locations are in off-chip memory, so actually reading or writing values to the memory locations consumes memory access bandwidth. In contrast, the global uniform table is typically stored on-chip. So on-chip processing units can quickly refer to the values of the memory locations using the global uniform table instead of having to access the off-chip memory.

Without the ZBC command, clearing a buffer, a depth buffer (e.g., z-buffer) or color buffer requires actually writing a value (e.g., a value representing a maximum depth value or a value representing a single color) to all the memory locations of the buffer being cleared. When the ZBC command is used, the value is first stored in an entry of the global uniform table and an index corresponding to the entry is stored for the buffer that is cleared. Multiple entries are available in the uniform value table, enabling different buffers to be cleared to different values. When a buffer is compressed using ZBC, the index is a compressed representation of all of the values within the buffer (hence, ZBC mechanism can be considered a dictionary-based compression).

The ZBC mechanism reduces the off-chip memory bandwidth consumed to clear (write) buffers and to read cleared buffers. However, the existing ZBC mechanism has at least two drawbacks. The performance of ZBC compression is limited by the capacity of the global uniform table. When all of the entries have been used to store values, it is difficult (e.g., time consuming) to reclaim or free any entries to store new values, even when a particular value in the table is no longer referenced. Thus, there is a need to extend the capabilities of such dictionary-based compression mechanisms that can be used not only for compressing graphics-related data stored in off-chip memory, but also for compressing any type of data that may at times have only values that are uniform (e.g., same).

SUMMARY

A method, computer readable medium, and system are disclosed for dynamic uniform value hardware compression. In one embodiment, a method for dynamically compressing values includes the steps of receiving a first value to be stored in a first granule among a plurality of granules, determining that if the first value is stored in the first granule, all of the values stored in the plurality of memory locations associated with the first granule will have a uniform value, determining that the first value is stored in a table at a first index in the table, and updating a first CSI, which corresponds with the first granule, to indicate that the first granule is compressed and to indicate that all of the values of the first granule has a uniform value as the value associated with the first index in the table. Each granule in the plurality of granules is associated with a plurality of memory locations of a memory for storing a plurality of values, and each of the plurality of granules is associated with a corresponding compression state information (CSI). The table holds a plurality of values, wherein each of the values in the table is associated with a unique index, where the first value was previously stored in the table due to receiving a command to write the first value in the table.

DETAILED DESCRIPTION

The conventional zero-bandwidth clear (ZBC) mechanism relies on a single global uniform table. Hence, the number of different values that can be used to clear buffers to a uniform value via ZBC compression is limited to the number of entries in the global uniform table. As described further herein, the conventional ZBC mechanism is enhanced, for example, by extending the number of values that can be used for ZBC encoding beyond on-chip storage limitations.

Figure 1A:
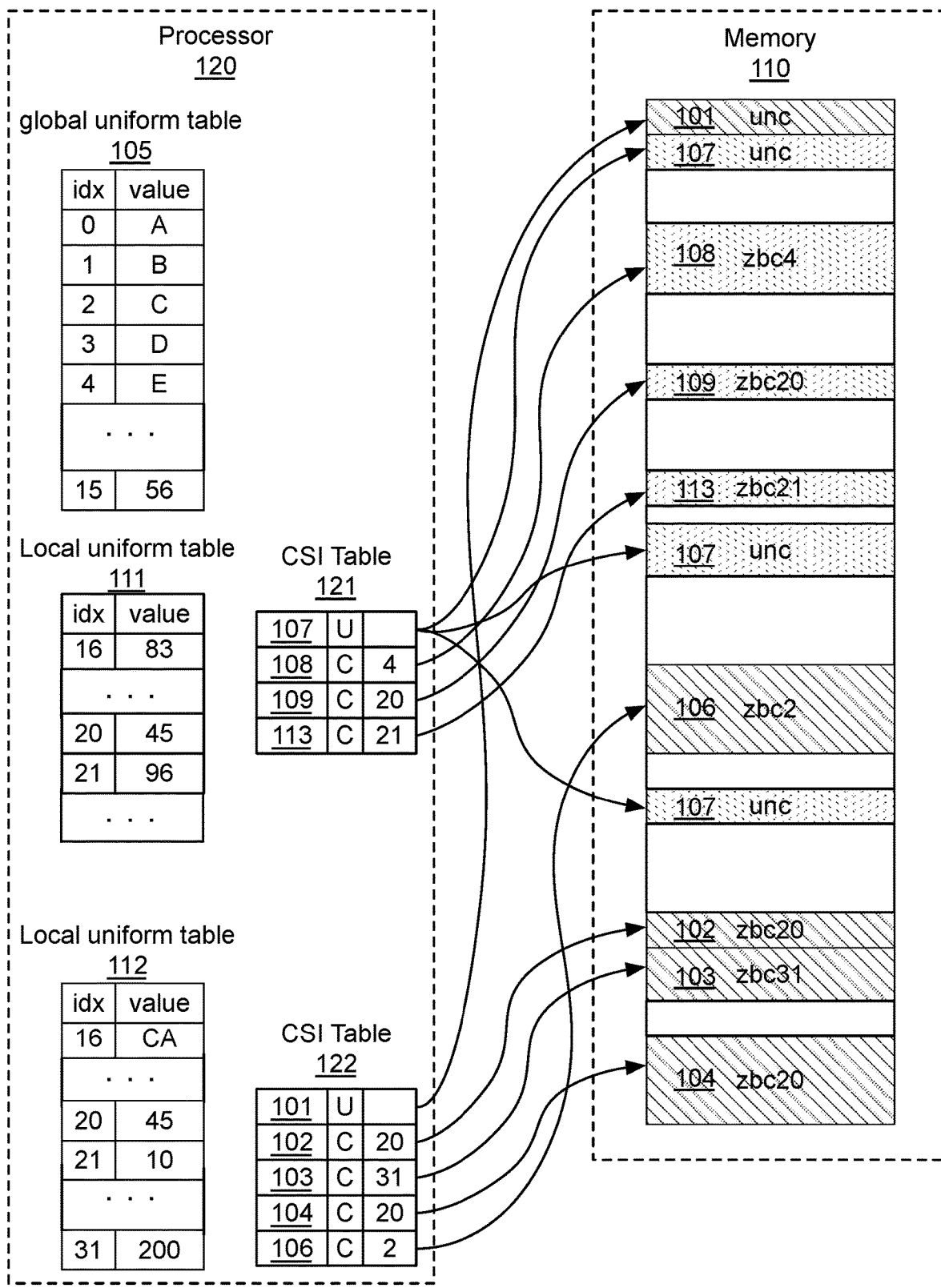
FIG. 1A illustrates an exemplary system.

FIG. 1A illustrates an exemplary system including a processor 120 and a memory 110, in accordance with an embodiment of the present disclosure. In the context of the following description, a region is a portion of a memory that is associated with a local uniform table, such as a local uniform table 111 or 112. All regions are associated with the global uniform table, such as a global uniform table 105. Multiple regions may be defined within a memory, such as memory 110. In an embodiment, all regions are of equal size. In another embodiment, regions can have different sizes. Regions may also be contiguous or non-contiguous. In an embodiment, the size or capacity of a region is configurable as 2-5 MB of data. As shown in FIG. 1A, memory 110 includes two regions indicated by different patterns (dotted or striped).

A plurality of memory locations that is associated with a single compression state information (CSI) is referred to as a granule. As described further below, CSI can indicate whether all the values stored in the plurality of memory locations of a granule are uniform. Each region can be associated with one or more granules. In an embodiment, one or more granules is associated with a tile of a texture bitmap, where the texture bitmap is divided into multiple tiles.

When all of the values in a granule are uniform (the same or near-equal), the entire granule may be encoded using ZBC compression. Values of a granule are near-equal to each other if the difference between each value in a granule is within a predefined threshold of an anchor value. The anchor value may, for example, be a value in the granule, an average of the values of the granule, or the value occurring most often in the granule.

A value may be encoded in any number of bits or bytes. For example, a value can be encoded in one, two, four, eight, or sixteen bytes. In an embodiment, a value represents one or more pixels, texels, depths, neural network weights, neural network activations, or any other type of data.

As shown in FIG. 1A, a first region includes granules 107, 108, 109, and 113 (shown with a dotted pattern), and a second region includes the granules 101, 102, 103, 104, and 106 (shown with a striped pattern). Each granule is associated with a CSI as shown in FIG. 1A. In an embodiment, memory locations in the memory 110 corresponding to a set of granules (e.g., a region) or a single granule may or may not be contiguous. In other words, the memory locations in the memory 110 associated with a single granule and/or a single region may be contiguous or non-contiguous. In an embodiment, CSI tables 121 and 122 contain entries, where each entry maps memory locations in the memory 110 (a granule) with a CSI. The memory locations associated with each granule may be one or more physical or virtual memory addresses and/or ranges of physical or virtual memory addresses. In an embodiment, each CSI table corresponds to a different region and each CSI table references a local uniform table.

As shown in FIG. 1A, CSI table 121 for the first region indicates the granule 107 (non-contiguous) within the first region is uncompressed (as indicated by "U" in CSI table 121 and "unc" in Memory 110). The uncompressed values are stored in the memory 110 may or may not be uniform. The CSI table 121 further indicates that granule 108 within the first region is ZBC compressed (as indicated by "C" in CSI table 121) and therefore all of the values in granule 108 are uniform. The CSI table 121 further indicates that the uniform value for granule 108 can be found at index (idx) 4 in one of the uniform tables associated with the first region, either the global uniform table 105 or the local uniform table 111. As shown in FIG. 1A, indices 0-15 correspond to an entry in the global uniform table 105 and indices 16 and greater correspond to an entry in the local uniform table 111. The value stored in the global uniform table 105 at index 4 is "E." Thus, all of the values for the granule 108 all have the same value "E". In an embodiment, the global uniform table 105 is always stored on-chip instead of being stored in off-chip memory. In an embodiment, the local uniform table 111 and CSI table 121 is stored on-chip when the first region is being accessed by the processor, but tables 111 and 121 may be saved off-chip, for example, onto memory 110 when the first region is not be accessed by the processor. Typically, the bit width of a value in the uniform tables is greater than the bit width of an index in those tables.

As further indicated in CSI table 121, granule 109 within the first region is ZBC compressed and the uniform value for granule 109 can be found at index (idx) 20 in the uniform tables associated with the first region (which are global uniform table 105 and local uniform table 111). In an embodiment, the most-significant bit (msb) of an index in the CSI table 121 or 122 selects between the global and local uniform tables associated with the granule, and the remaining bits are used as the index to select an entry in the tables. For example, if indices are represented by 5-bits, the most significant bit indicates whether the index corresponds to the global uniform table (e.g. when msb equals 0) or the local table (e.g., when msb equals 1), and the remaining 4-bits indicate the specific entry in the table. Under that example, an index value of 20 (which in binary is 10100) would indicate that corresponding uniform value is stored in the local table (given that msb of 10100 is 1) and the uniform value is located at the 4th entry (given that binary value of 0100 is 4) in the local table. Returning to FIG. 1A, ZBC compressed granule 109 is associated with index 20 of the local uniform table 111. The value stored in the local uniform table 111 at index 20 is "45." Thus, all of the values for the granule 109 all have the same value "45." The remaining granule within the first region (granule 113) is ZBC compressed and all of the values within that granule has a value of "96" as indicated by CSI table 121 and local uniform table 111.

As shown in the CSI table 122, one of the granules in the second region (granule 101) is uncompressed and the remaining granules (granule 102, 103, 104, and 106) are ZBC compressed. As noted above, the second region is associated with global uniform table 105 and local uniform table 112. Hence, the indices 20, 31, and 2 referenced in CSI table 122 refer to entries in global uniform table 105 and local uniform table 112. As shown, in FIG. 1A, granules 102 and 104 are ZBC compressed and all of the values of granules 102 and 104 have the value "45" (which is the value at index 20 of the local uniform table 112). Granule 103 is also ZBC compressed and all of the values of granule 103 have the value "200" (which is the value at index 31 of the local uniform table 112). Finally, granule 106 is ZBC compressed and all of the values of granule 106 has the value "C" (the value at index 2 of the global uniform table 105).

When a granule is ZBC compressed, the actual values stored in memory 110 for the granule may be unspecified or garbage values. Since the processor 120 can obtain all of the values for a ZBC compressed granule by inspecting a CSI table and a uniform table associated with the granule, processor 120 does not need to rely on what is actually stored for the granule in memory 110. Accordingly, processor 120 does not need to access memory 110 to obtain values for any granules that are ZBC compressed.

In an embodiment, the global uniform table 105 and the local uniform tables 111 and 112 have the same number of entries. In another embodiment, the global uniform table 105 has a different number of entries compared with the local uniform tables 111 and 112. In yet another embodiment, the global uniform table 105 and each of the local uniform tables 111 and 112 may have a different number of entries. In an embodiment, more than one local uniform table may be associated with a single region. However, any local uniform table is only associated with one of the regions and is therefore, exclusive to the region with which the local uniform table is associated. In contrast, the global uniform table is associated with all of the regions. In an embodiment, only the global uniform table is used and none of the regions are associated with a local uniform table. In another embodiment, only local uniform tables are used and none of the regions is associated with a global uniform table. In an embodiment, each region includes an equal number of granules. In another embodiment, each region may include a different number of granules.

Figure 1B:
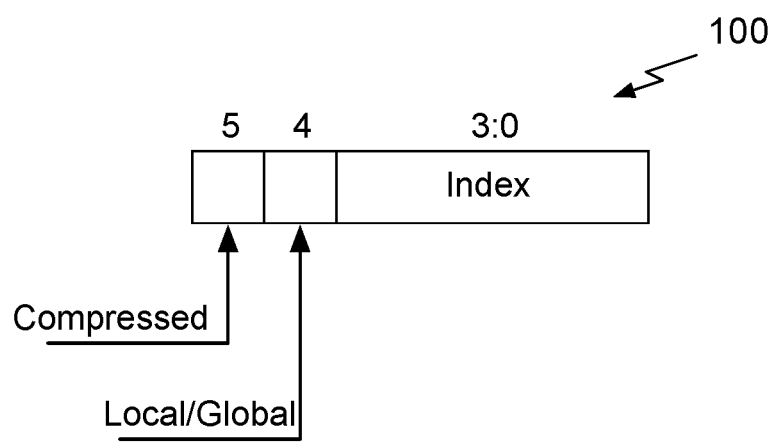
FIG. 1B illustrates an exemplary encoding for CSI.

FIG. 1B illustrates an exemplary encoding 100 for CSI, in accordance with an embodiment. As shown in FIG. 1B, encoding 100 for a CSI of a granule includes six bits [5:0]. The msb (bit 5) defines whether the granule is ZBC compressed or not compressed. For example, bit 5 is asserted (or set to 1) when the granule is ZBC compressed and is negated (or set to 0) when the granule is not compressed (i.e., when the values are uncompressed). If the $5^{th}$ bit of the CSI encoding 100 indicates that its corresponding granule is ZBC compressed, the $4^{th}$ bit of the CSI encoding 100 indicates whether the uniform value for the granule is located in the global or local uniform table associated with granule. For example, if the $4^{th}$ bit of encoding 100 is a 0, then the uniform value is located in the global uniform table. Otherwise, if the $4^{th}$ bit is a 1, then the uniform value is located in the local uniform table. The remaining bits (bits [3:0]) define the index into either the global or local uniform table for obtaining the uniform value of the granule.

In an embodiment, if other compression formats are used in addition to ZBC compression, additional one or more bits can be included in CSI encoding 100 to indicate which of the compression formats is being used for the granule. In an embodiment, at least one additional type of compression is supported. For example, when VDC (variable differential compression) is used the VDC compressed values require half the storage as when the values are not compressed. When VDC is supported, one or more of the granules may be compressed using VDC (e.g., a 256 B granule can be compressed to 128 B). The compressed values are stored in a granule, consuming half of the total granule capacity. In an embodiment, the VDC compressed values from the granule are retrieved by a processor from its external memory when the CSI for a granule indicates that the granule is VDC compressed. In such an embodiment, the processor decompresses the VDC compressed value to obtain the uncompressed values of the granule. In an embodiment, each granule has the capacity to store uncompressed values (even when values are compressed).

In a conventional system which includes only a global uniform table, the index into the table may be represented by five bits and the global uniform table may store up to 32 different global uniform values. In an embodiment, to enable the use of exclusive per-region local uniform tables without increasing the number of uniform values stored in a processor, the number of indices available for the global uniform table is halved. For example, instead of providing 32 indices in the global uniform table, only 16 indices are available in the global uniform table and 16 indices are available in each local uniform table. Furthermore, in an embodiment, only a single local table may be cached in the processor at any point in time and one of several different local tables is loaded into the processor as needed. Hence, in such an embodiment, the global table and the local table being used occupy the same amount of space a single larger global table would occupy in a conventional system. In another embodiment, multiple local tables may be cached in the processor simultaneously as needed to decompress multiple granules in parallel.

While the global uniform table is shared between all of the regions, each local uniform table is exclusive to a particular region. In an embodiment, the global uniform table is stored on-chip and the local uniform tables are stored off-chip and may be cached on-chip. In an embodiment, the local uniform tables and CSIs are metadata for data (such as a frame buffer, texture map, depth buffer, neural network weights, etc.). As metadata, local uniform tables and CSIs may be stored in one or more levels of on-chip caches with the off-chip memory serving as the backing storage. All sorts of caching optimizations (prefetch, eviction priority, etc.) understood by those skilled in the art can be applied to the metadata.

While the number of indices for the global uniform table may be reduced as compared with a conventional system employing only a global uniform table, the total number of indices available for each region is not reduced due to the addition of local uniform tables. Importantly, all CSIs may reference any global uniform table index. In addition, each CSI may reference any index of a local uniform table associated with the CSI's granule. As noted above, a local uniform table is exclusive to a region which includes one or more granules. The number of indices available to each region (or set of granules) may be increased by increasing the size (e.g., number of entries and indices) of the region's local uniform table. The greater the number of indices available to a region, the greater number of granules that can be ZBC compressed with each granule having a different uniform value. An alternative technique is to reduce the number of granules associated with each region. For example, if a local uniform table can store only 4 uniform values, limiting regions to only 4 granules will ensure that each of the granules in the region can be ZBC compressed with each granule having a different uniform value. If a granule cannot be ZBC compressed because no additional entry is available in the global or local uniform value tables to store a uniform value for the granule, the granule is stored in uncompressed format in external memory.

As previously described, in an embodiment, multiple regions of the same size may represent a single buffer (e.g., a frame buffer). When the region size is reduced, the number of regions needed to represent the same buffer would need to be increased. Additionally, if the size of each granule remains a constant, each region would need to be associated with fewer number of granules. The sizes of the granule and regions may vary in a system. Different sized granules and regions can be used for different buffers. Also, a single buffer may be represented by a set of differently sized regions, with each region having differently sized granules. In an embodiment, the size of a granule can be from 128 to 2048 bytes (inclusive). In an embodiment, the granule size is equal to the amount of data from external memory that can be stored in a cache line. In an embodiment, a region includes 2 to 256 granules. Therefore, the number of granules and regions used to represent a single buffer is adjustable. Since each region is associated with its own local uniform table, the number of uniform table entries available for all granules associated with a single buffer can be increased or decreased by adjusting the number of regions representing the buffer.

For example, when the number of regions representing a buffer is increased from 32 to 128, the memory size of each region is reduced by a factor of four. If the granule size remains constant before and after the increase in the number of regions, the number of granules and associated CSIs for each region is also reduced by a factor of four. But each region continues to have the same sized local uniform table before and after the increase in the number of regions. Hence, the number of local uniform table entries for the entire buffer has increased by up to a factor of four. In some instances, a newly sized region may have local table entries that are not being referenced by any granules in the region. In those instances, such local table entries may be reclaimed for ZBC compressing other uncompressed granules in the region. Hence, after the increase in the number of regions, more granules associated with the buffer may be ZBC compressed. In an embodiment using a four bit index field as shown in CSI encoding 100, the total number of uniform value indices potentially available for the buffer is 16 (total number of global uniform value table entries)+16N (total number of local uniform value table entries multiplied by the number of regions N used to represent the buffer). As compared to a conventional system that has only a single 32 entry global uniform value table, the use of local tables as disclosed herein greatly increases the number of granules that can be compressed with different uniform values.

Figure 1C:
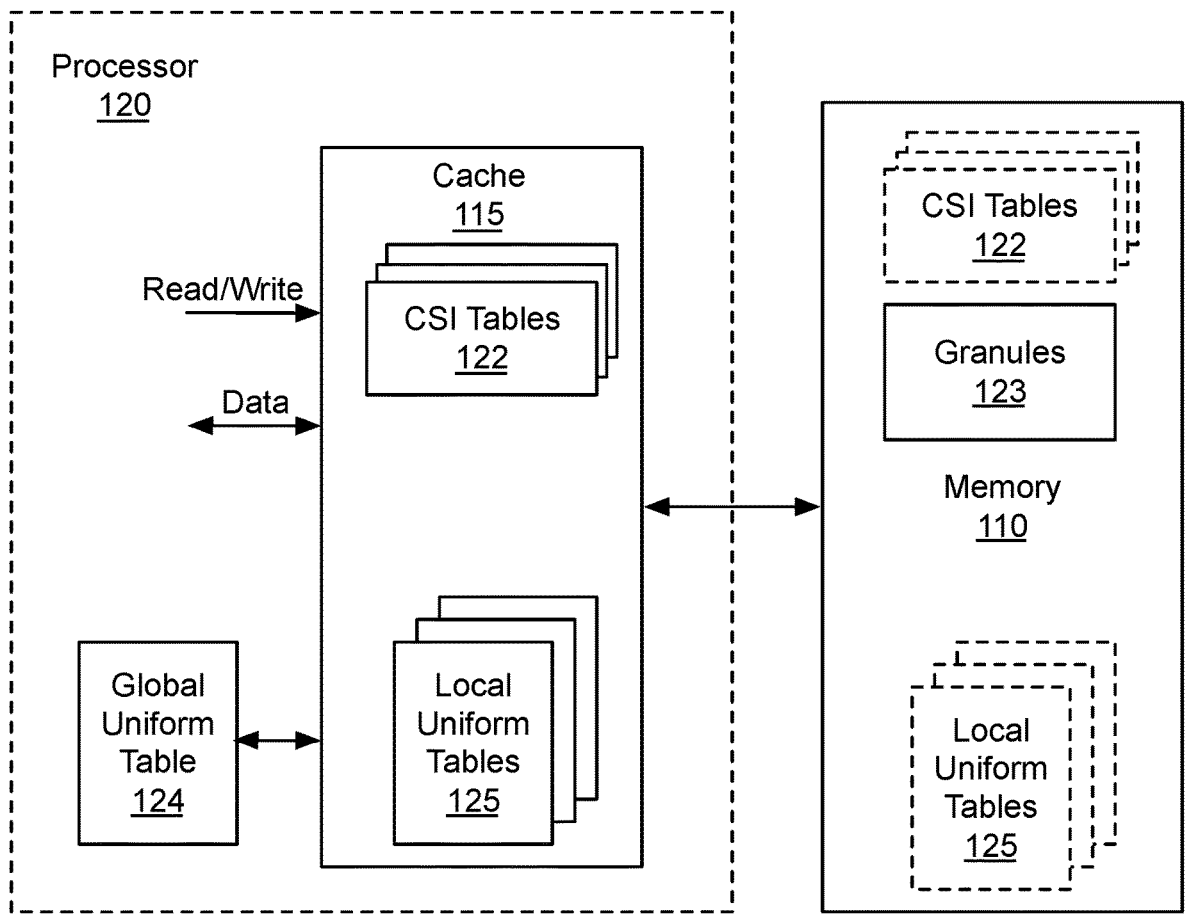
FIG. 1C illustrates another exemplary system.

FIG. 1C is another exemplary system that includes a processor 120 and a memory 110, in accordance with an embodiment of the present disclosure. Processor 120 includes a cache 115. Cache 115 may store one or more local uniform tables 125 and one or more CSI tables 122. Processor 120 may be a GPU (graphics processing unit), CPU (central processing unit), or any processor capable of utilizing a global uniform table 124, the local uniform tables 125, and CSI tables 122.

As discussed above, a global uniform table sXuch as 124 and one or more local uniform tables such as 125 store uniform values. Each of the local uniform tables 125 is associated with a region and one of the CSI tables 122. Each entry of a CSI table is associated with one of the granules 123 in memory 110.

In an embodiment, a region in memory 110 may represent a buffer (such as a frame buffer). To clear the entire buffer by setting all of the values of the buffer to a single value, the value is first written to an unused entry in either the global uniform table 124 or a local uniform table 125 that is associated with the region. Next, all of the CSI entries in the CSI table 122 associated with the granules of the region are modified to indicate that the granules are ZBC compressed and that the uniform value for the granules is stored at the appropriate index in either the global uniform table 124 or the local uniform table 125 associated with the region. In an embodiment, such clearing of a buffer is performed by processor 120 in response to receiving a clear command from, for example, software executing on the processor 120 where the command identifies the buffer to be cleared and the value to set uniformly across the entire buffer. By applying ZBC compression in this manner, the entire buffer may be cleared to a single value by modifying only the CSI table 122 and either a global uniform table 124 or a local uniform table 125. Without using ZBC compression, all of the values in memory 110 associated with the buffer would need to be overwritten with the clear value.

In an embodiment, software determines the uniform values that are written to the global uniform table 124 and/or the local uniform tables 125 based on prior profiling that identifies popular uniform values. In an embodiment, the local uniform tables 125 are written dynamically, without receiving a clear value command, as uniform values are identified for granules 123 by the processor 120. The dynamic detection and writing of uniform values to the local uniform tables 125 is described in further detail in conjunction with FIGS. 2A and 2B below.

Each of the global uniform table 124, local uniform tables 125, and CSI tables 122 may be stored in dedicated on-chip storage outside of cache 115, in dedicated portions of cache 115, or in non-dedicated entries of the cache 115. The cache 115 may be at any level of the memory hierarchy, such as a level 1 (L1) cache, level 2 (L2) cache, etc. In an embodiment, cache 115 is the L2 cache 460 shown in FIG. 4B. In an embodiment, cache 115 is the shared memory L1 cache 570 shown in FIG. 5A.

Memory 110 may serve as the backing storage for any local uniform tables 125 and CSI tables 122 that are used by processor 120, in which case some or all of the local uniform tables 125 and CSI tables 122 may be stored in memory 110. The local uniform tables 125 and CSI tables 122 are metadata for one or more regions. When such metadata are stored in the cache 115, optimizations such as prefetch, eviction priority, etc. may be applied to minimize access latency. In an embodiment, cache entries storing such metadata have high priority for retention compared with other data stored in the cache 115 to reduce the likelihood of eviction.

Figure 1D:
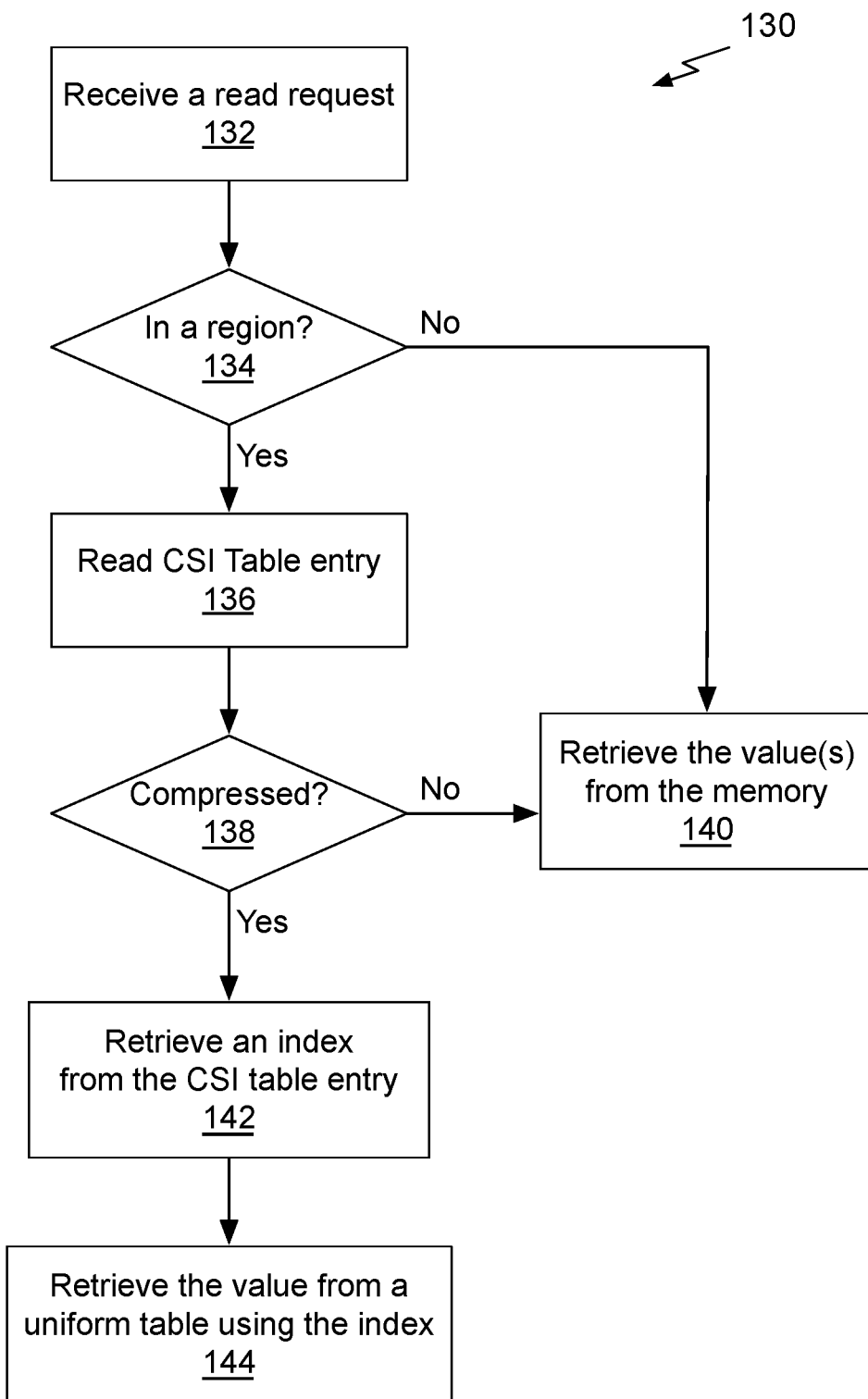
FIG. 1D illustrates an exemplary flowchart of a method for retrieving values from memory.

FIG. 1D illustrates an exemplary flowchart of a method 130 for retrieving values from memory. At step 132, a read request is received. At step 134, the processor 120 determines if the address included in the read request is within a region. Prior to accessing a region, memory locations in memory 110 are associated with granules of the region. The memory locations for a granule may be identified explicitly using addresses and/or address ranges. Alternatively, the memory locations for a granule may be implicitly identified using the start address for the region and size or offset information for each granule in the region. For example, if all the granules of a region are of the same size and are contiguously addressed, the memory locations associated with each granule in the region can be computed using the start address of the region and the size of the granules.

If, at step 134, the address is not associated with a region, then the address is used to read value(s) from memory 110 at step 140 and return the value(s) in response to the read request. Otherwise, at step 136, an entry is read from the CSI table for the granule associated with the address. For example, referring to FIG. 1A, when the address is associated with the first region, the address is used by the processor 120 (or cache 115 as shown in FIG. 1C) to read an entry from the CSI table 121. The address corresponds to one of the granules 107, 108, 109, 113 or another granule that are included in the first region. When the address corresponds to the granule 107, the value(s) to be read are uncompressed. When the address corresponds to granules 108, 109, or 113, the value(s) to be read are compressed as indicated in the CSI Table 121.

If, at step 138, the CSI entry indicates that the granule to be read is uncompressed, then the address is used to read value(s) from memory 110 at step 140 and return the value(s) in response to the read request. Otherwise, at step 142 an index is read from the CSI entry for the granule associated with the address. For example, when the address corresponds to the granule 108, the value(s) to be read are ZBC compressed and the uniform value for the granule is located at index=4 of the global uniform table 105. At step 144, the processor 120 (or cache 115 as shown in FIG. 1C) uses the index to read the uniform value from the global uniform table 105 or the local uniform table 111. The uniform value is then returned in response to the read request.

In an embodiment, a read or write to a granule causes the CSI for the granule to be fetched from memory 110 into the cache 115 as shown in FIG. 1C. The read or write to the granule may also cause the local uniform table for the region that includes the granule to be fetched into the cache 115. In an embodiment, a 16-entry local uniform table with 16-byte uniform values may be as large as 256-bytes and may be stored in two 128-byte cache lines, with each cache line holding 8 entries of the local uniform table. Cache lines storing the local uniform table should support reads and writes, including writeback or write-through support.

Regions may be cleared to a single uniform value by writing entries in the CSI tables instead of clearing the relevant granules 123 in memory 110 by writing the uniform value to all value locations in memory 110 for the relevant granules. In an embodiment, uniform values are first written to the global and local uniform tables and then the CSI tables are written with indices corresponding entries in the global and local uniform tables. For example, all of the granules of a region may be cleared to a single uniform value by setting the index of all the CSI entries for all of the granules in the region with the same index. Alternatively, each granule of a region may be cleared to a different uniform value by writing different index values in the CSI entries for the granules of the region.

Figure 1E:
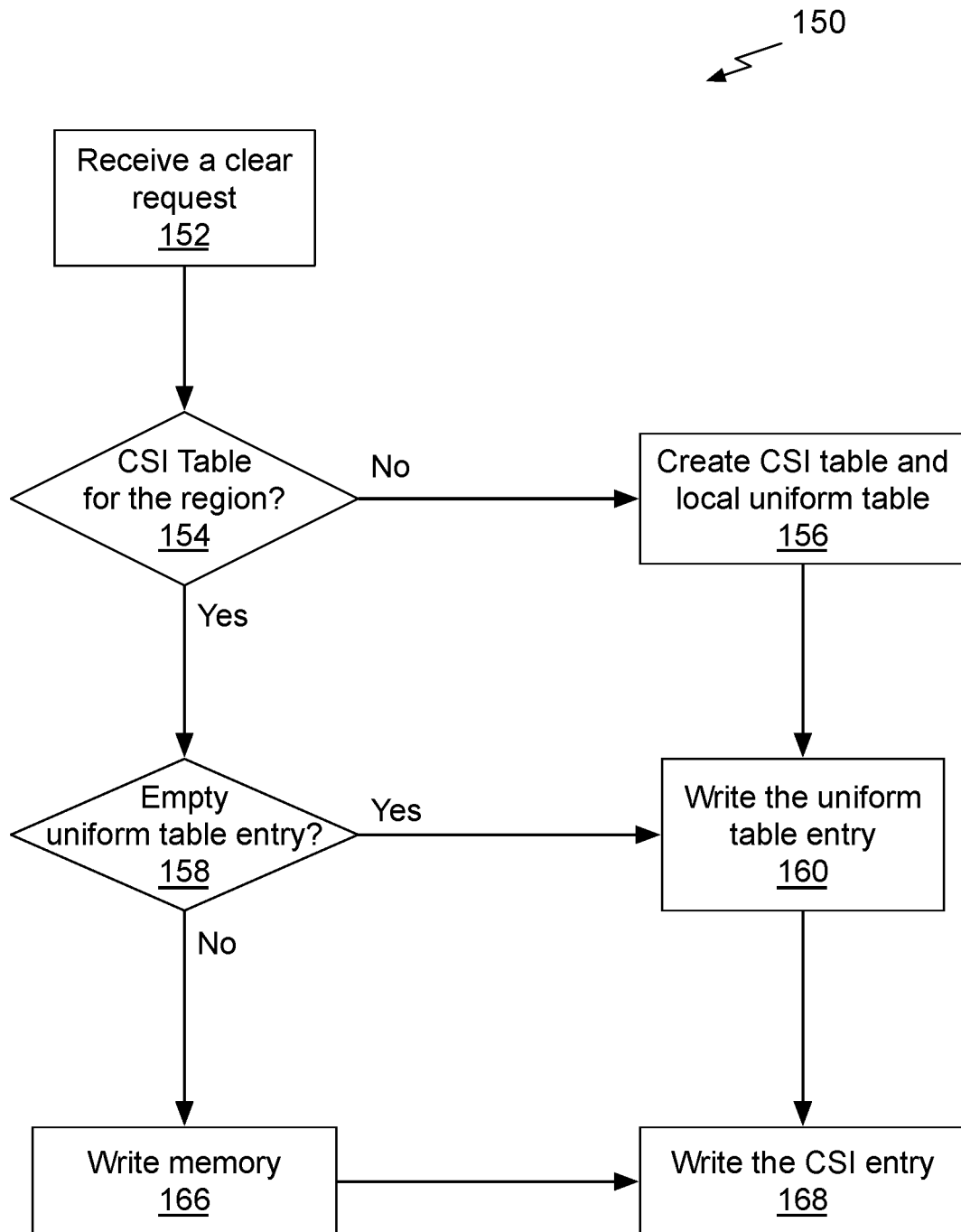
FIG. 1E illustrates an exemplary flowchart of a method for clearing values in memory.

FIG. 1E is an exemplary flowchart of a method 150 for clearing values in memory. At step 152, processor 120 (or cache 115 as shown in FIG. 1C) receives a request to clear a region or a granule. In an embodiment, the request is provided via a clear instruction identifying a region or a granule (e.g., such as with a memory address) and the value to be used to uniformly set all values of the region or granule. In another embodiment, the processor 120 (or cache 115) dynamically determines if the values of an uncompressed granule or a region is uniform or will become uniform in servicing a request to update a value in the granule or the region, and internally generates the request to clear the granule or region to its uniform value. The clear request may be for a single granule or multiple granules within the region. At step 154, processor 120 (or cache 115) determines if a CSI table exists for the region associated with the clear request. If a CSI table does not exist, then at step 154 a CSI table and a local uniform table are created for the region. If a CSI table and a local table cannot be created, the clear request may be serviced by writing the uniform values directly to the memory locations associated with the relevant region or granule.

After the CSI table and local uniform table are created at step 156, the uniform value included in the clear request is written to an entry in the global or local uniform table at step 160. At step 168, the index for the entry written at step 160 is stored in the CSI table for the relevant granules. If the entire region is cleared, the CSI table entries for all of the granules of the region are set the index of the entry written at step 160.

Returning to step 154, when the processor 120 (or cache 115) determines that a CSI table exists for the region, then at step 158, the processor 120 (cache 115) determines if an empty entry is available in a uniform value table. In an embodiment, the cache 115 may first check for an empty (unused) entry in the local uniform table that is exclusive to the region before checking for an empty entry in the global uniform table that is shared by the regions. At step 160 the uniform value included in the write request is written to the empty uniform table entry identified at step 158. At step 168, the index for the entry written at step 160 is stored in the CSI table for the region.

Returning to step 158, when the processor 120 (or cache 115) determines that an empty entry is not available in a uniform value table, then at step 166, the uniform value included in the clear request is written to memory 110 for all values associated with the granules relevant to the clear request. At step 168, the entries in the CSI table for the granules are written to indicate that the granules are uncompressed.

In an embodiment, the clear request is a region clear request that clears all granules in the region to a uniform value, effectively overwriting all entries in the local uniform table 125. Therefore, it is not necessary to check if an entry is available in the uniform tables and step 158 may be omitted. When a CSI table is present, processor 120 (or cache 115) may proceed directly to step 160, without completing step 158, and first clear the local uniform table 125 so that all entries become empty (e.g., invalid) and then write the value to an entry in the local uniform table 125. When a region clear request is executed, all entries in the local uniform table 125 are reclaimed en masse. At step 168, the index for the entry written at step 160 is stored in the CSI table for all granules in the region.

In an embodiment, a count is maintained for the global uniform table 124, where the count indicates the number of entries in the global uniform table 124 that store uniform values. Similarly, a count may be maintained for each one of the local uniform tables 125. The count(s) may be used at step 158 to determine whether a uniform table has an empty entry. The count may be cleared by software when a new application is launched or at other times, such as before all of the regions are cleared. For example, an application programming interface (API) clear call may be used to clear the count. In an embodiment, a region clear request clears the count for the region being cleared. The count for a particular table is updated (e.g., incremented) for each entry that is written and once the count reaches a maximum value (equal to the number of entries), the table cannot be written until the count for the table is cleared. In another embodiment, each of the global uniform table 124 and local uniform tables 125 may maintain a flag for each of its entries indicating whether the entry is valid or invalid. In such an embodiment, an entry is empty if its corresponding flag is set as invalid. The flags may be inspected at step 158 to determine whether a uniform table has an empty entry.

In an embodiment, all entries in the local uniform tables are reclaimed en masse by the driver software or the processor 120 performing an in-place decompress of all of the compressed granules, clearing the count, and updating the CSI entries for each granule as being uncompressed. Optionally, any compressed granules referencing the global uniform table 105 may remain compressed during such an en masse reclamation of the local uniform table.

The various embodiments disclosed herein preserve the benefits of the conventional ZBC mechanism of reducing the off-chip memory bandwidth consumed to clear regions and to read cleared regions while providing additional benefits of local uniform tables 125 and overcoming drawbacks of the conventional ZBC mechanism. For example, the various present embodiments are not limited by the capacity of the global uniform table. Many applications will benefit from being able to use ZBC compression for a greater number of uniform values than can be stored using only a single global uniform table. For example, different game scenes may use different clear colors specified through an API. Scene dependent lighting and other effects may produce a large spectrum of scene-specific uniform values for gaming and other types of applications. In the various present embodiments, the capacity of the uniform tables is scalable through the use of local uniform tables. Because a local uniform table 125 is associated with each region, the number of local uniform table entries for storing uniform values for a buffer can be increased by sub-dividing the buffer into more regions. Conversely, the number of local uniform table entries for a buffer can be decreased by merging regions of a buffer into fewer regions.

Additionally, the various present embodiments overcome a major drawback of conventional ZBC mechanisms. When all of the table entries of a global uniform value table have been used to store uniform values, it is difficult (e.g., time consuming) to reclaim or free an entry to store a new uniform value. Typically, an entry can be reclaimed only if no regions reference the entry. But given that multiple regions share the global uniform value table, it is difficult to identify when no region is relying on an entry in the global uniform table. In contrast, the various present embodiments associate a separate local uniform table that is exclusively used by each region. Hence, entries in the local uniform table can be more easily freed or reclaimed given that only a single region needs to be considered when attempting to modify a local uniform table.

Dynamic Uniform Value Hardware Compression

As previously explained, the ZBC mechanism reduces the off-chip memory bandwidth consumed to clear (write) regions and to read cleared regions. However, a drawback of conventional ZBC mechanisms is that ZBC compression can only be performed using a clear command via an API call. Buffers or portions of buffer may, however, dynamically become uniform as different values are written to the buffer. For example, through graphics API draw calls, compute API calls, and copy API calls, a buffer or a portion of a buffer may all of sudden become uniform such that all values in the buffer or the portion have the same or near-same value.

Accordingly, in various present embodiments, values within a granule are checked for uniformity when a value is written or modified in the granule. When the values are uniform, the processor (or cache) checks if the uniform value matches any of the uniform values stored in the uniform tables. When a match is found, the corresponding index is stored in the CSI entry for the granule. In an embodiment, the processor (or cache) may also write uniform values into empty entries of the uniform tables. In an embodiment, when there are no the entries available in a uniform table, additional entries may be dynamically created by, for example, sub-dividing an existing region into multiple smaller regions each smaller region associated with its own local uniform table.

In an embodiment, when no entry is available in either the local uniform table for a region and/or the global uniform table, the region is split into two or more separate smaller regions. The local uniform table and the CSI table for the region are cloned for each new smaller region, and for each new smaller region, entries (in the uniform table and CSI table) for granules that are not in the smaller region are emptied. In another embodiment, an additional entry is created in the local uniform table for the region when an empty entry is not available for writing a uniform value. In another embodiment, an additional entry is created in the global uniform table when an empty entry is not available for writing a uniform value.

Figure 2A:
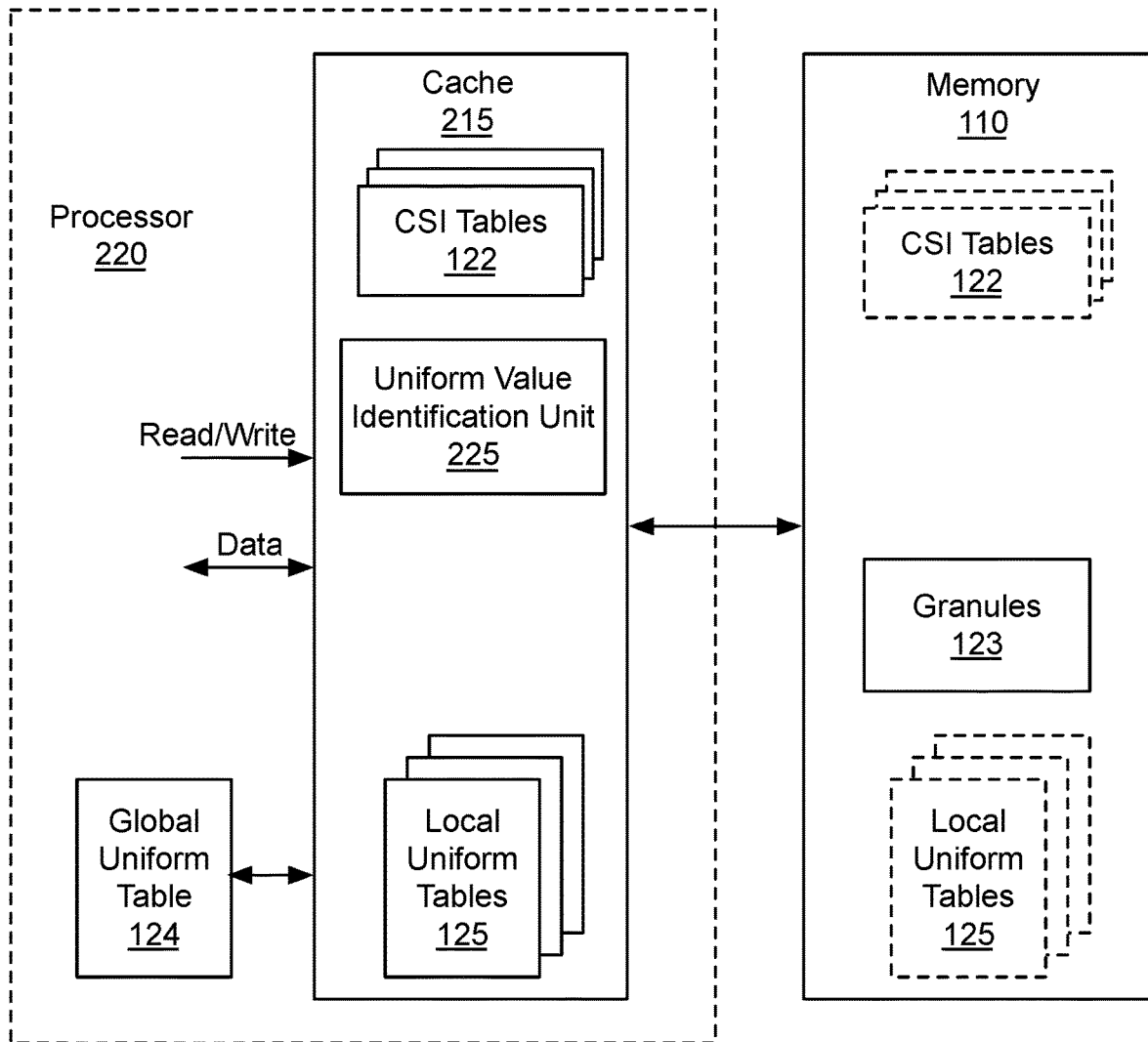
FIG. 2A illustrates another exemplary system.

FIG. 2A illustrates another exemplary system. The exemplary system includes a processor 220 and the memory 110. Compared with the processor 120 shown in FIG. 1C, the processor 220 includes a cache 215. Cache 215 includes a uniform value identification unit 225 that is configured to detect when a granule is uniform and may be ZBC compressed. Although FIG. 1C depicts the uniform value identification unit 225 within cache 215, other embodiments may include unit 225 in other portions of processor 220. For example, the uniform value identification unit 225 may be included in a memory partition unit 380 shown in FIG. 4B or in the load/store units (LSUs) 554 shown in FIG. 5A.

In an embodiment, the uniform value identification unit 225 may write uniform values to the global uniform table 124 and local uniform tables 125 in response to receiving a clear command using, for example, the exemplary method 150 of FIG. 1E. In an embodiment, the local uniform tables 125 are not implemented in either the processor 120 (or cache 215) or the memory 110 and only the global uniform table 124 is available for storing uniform values. In another embodiment, the global uniform table 124 is not implemented and the uniform values can only be stored in the local uniform tables 125. The uniform value identification unit 225 may be configured to perform dynamic uniform value identification using the global uniform table 124 and/or the local uniform tables 125.

In an embodiment, during a write operation to memory 110, the uniform value identification unit 225 may identify a uniform value for a granule when the entire granule is written and all of the values being written are uniform (the same or near-equal). In another embodiment, the uniform value identification unit 225 may identify a uniform value for a granule when only a portion of the granule is written and the granule will be uniform after the portion is written.

After the uniform value identification unit 225 identifies a uniform value for the granule, unit 225 may search the uniform value tables for the uniform value. When the uniform value is already stored in either the global uniform value table or the local uniform table for the granule, the index of the entry that stores the uniform value is obtained. The uniform value identification unit 225 can then dynamically ZBC compress the granule by storing the index in the granule's CSI table entry and marking the CSI table entry as ZBC compressed.

When the uniform value is not found in a table, it may be stored in an unused entry in a uniform table and the corresponding index is stored in the CSI table entry for the granule. When no entry is available in a uniform table, the CSI table entry for the granule is written with the ZBC compression bit negated and the uniform values are actually stored in the granule in memory 110 in either a different compression format or in an uncompressed format.

In an embodiment, software uses profiling data to identify popular uniform values. The popular uniform values may then be written to the global uniform table 124 and/or the local uniform tables 125 using a clear value command with the expectation that such uniform values will be used to ZBC compress granules. In an embodiment, the uniform value identification unit 225 performs uniform value profiling by maintaining a histogram tracking the frequency of the occurrences of dynamically detected uniform values. For example, the histogram may keep a tally of the number of times a particular uniform value was detected during a certain time period. In an embodiment, per-region histograms are maintained instead of or in addition to a single global histogram. A global histogram is useful for identifying values for the global uniform table while the per-region histograms are useful for identifying values for each local uniform table. In an embodiment, a per-index count is maintained in a uniform value table, where the count indicates the number of granules that reference each index. A uniform value count may also be maintained for each uniform value that could not be stored in a uniform value table, where the count indicates the number of granules that are not ZBC compressed but could have been ZBC compressed if the uniform value had been added to a uniform value table. The per-index and/or uniform value counts may be used for profiling and to generate the histogram.

In an embodiment, the uniform value identification unit 225 implements a heuristic to determine when uniform values tracked by the histogram are added to an empty entry of a uniform table. Additionally, in an embodiment, the uniform value identification unit 225 implements a heuristic to determine uniform values to remove from the uniform tables. For example, during execution of a gaming application, the uniform value identification unit 225 may generate the histogram for M frames. After M frames the histogram is analyzed, and one or more uniform values are added, removed or replaced.

Figure 2B:
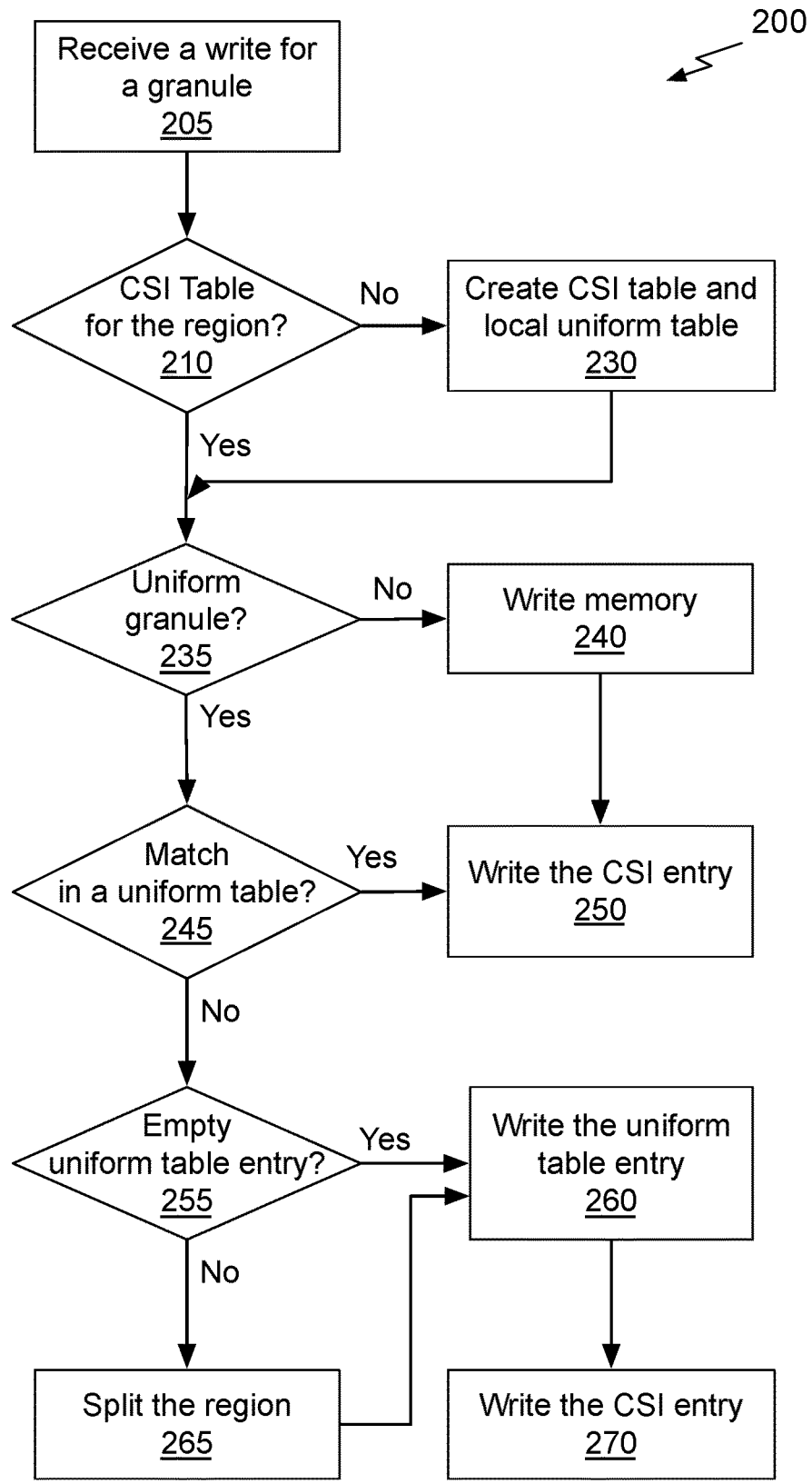
FIG. 2B illustrates an exemplary flowchart of a method for writing values to memory.

FIG. 2B illustrates an exemplary flowchart of a method 200 for writing values to memory. At step 205, the processor 120 (or cache 215) receives a write request for an address of a granule that is included in a region. Write requests for addresses that are not included in any region are written to the location(s) in the memory 110 corresponding to the address included with the write request. At step 210, the processor 120 (or cache 215) determines if a CSI table exists for the region associated with the address. If a CSI table does not exist, then at step 230 a CSI table and a local uniform table are created for the region. Alternatively, the write request is handled as though the address for the write request is not associated with a region as indicated above.

At step 235, the uniform value identification unit 225 determines whether writing the value(s) indicated in the write request to the granule will result in a uniform granule. The granule is uniform when all of the values in the granule are the same or near-equal. For example, when the granule stores 32-bit pixel values, the granule is uniform if all of the 32-bit pixel values in the granule are the same or near-equal. The uniform value identification unit 225 may compare all values in the granule to determine if the values are uniform. In an embodiment, all of the values in the granule are compared in parallel. In another embodiment, the values in the granule are compared iteratively. It will be appreciated by those skilled in the art that many different techniques may be employed to determine if the values of a granule are uniform.

If, the granule will not be uniform, the processor 120 (or cache 215) proceeds from step 235 to step 240 and stores the non-uniform value(s) to the locations in off-chip memory 110 associated with the granule. The values may be stored in an uncompressed format or in a different (non-ZBC) compressed format. For write operations that do not overwrite an entire compressed granule, the granule is first decompressed to merge the new value(s) with the existing values and then the granule may be recompressed or kept in uncompressed format. Following step 240, the CSI entry for the granule is written to indicate that the granule is not ZBC compressed.

If, at step 235, the granule will be uniform as a result of the write, processor 120 (or cache 215) checks if the value to be written matches a uniform value stored in either the global uniform table 124 or the local uniform table 125 for the granule.

In an embodiment, the global uniform table 124 and/or the local uniform table 125 are implemented as content addressable memory (CAM) that returns an index when a matching uniform value is stored in the CAM. When a matching uniform value is found in an entry, the uniform value identification unit 225 proceeds to step 250 and writes the CSI entry for the granule with the matching index. Otherwise, when the value to be written does not match a uniform value stored in a uniform table, at step 255, the processor 120 (or cache 215) determines if an empty entry is available in a uniform table. In an embodiment, the processor 120 (or cache 215) may first check for an empty (unused) entry in the local uniform table that is exclusive to the region before checking for an empty entry in the global uniform table that is shared by the regions. At step 260, the uniform value included in the write request is written to the empty uniform table entry identified at step 255. At step 270, the index for the entry written at step 260 is stored in the CSI table for the granule and the ZBC compression bit asserted.

Returning to step 255, when the processor 120 (or cache 215) determines that an empty entry is not available in a uniform value table, then at step 265, the processor 120 (or cache 215) splits the region into two (or in some embodiments multiple) smaller regions. In an embodiment, to produce two smaller regions, the CSI table for the original region is separated into two CSI tables and the local uniform table of the original region is cloned for the two smaller regions. Thus, the granule being written is associated with one of the two smaller regions because the CSI entry associated with the granule is included in the CSI table for only one of the two smaller regions. After the split, the combined number of CSI table entries in the separate CSI tables of the smaller regions equals the number of entries in the CSI table of the original region. But the combined number of entries available in the local uniform tables of the two smaller regions is double the number of entries available in the local uniform table of the original region. Uniform values that are no longer referenced by a CSI table in a smaller region are removed (e.g., by reducing a count of uniform values in the uniform value table) or invalidated (e.g., by asserting an invalid flag for an entry in a uniform value table) from the smaller region's local uniform table, thus emptying one or more entries in the smaller region's local uniform table. At step 260, the uniform value included in the write request is written to an empty uniform table entry of the smaller region. At step 270, the index for the entry written at step 260 is stored in the CSI table for the granule and the ZBC compression bit is asserted.

As previously explained, the ZBC mechanism reduces the off-chip memory bandwidth consumed to clear (write) memory blocks and to read cleared memory. However, a drawback of the existing ZBC mechanism is that ZBC compression can only be performed using a clear command at the Graphics API level. Dynamically generated buffers can benefit from ZBC compression when dynamic uniform value identification and ZBC compression is implemented in the processor 120 or 220. Additionally, the processor 120 or 220 may be configured to perform profiling by maintaining a histogram tracking the frequency of occurrence for dynamically detected uniform values and may also implement a heuristic to determine when values from the histogram are be promoted to the global uniform table 124 or the local uniform tables 125.

Parallel Processing Architecture

Figure 3:
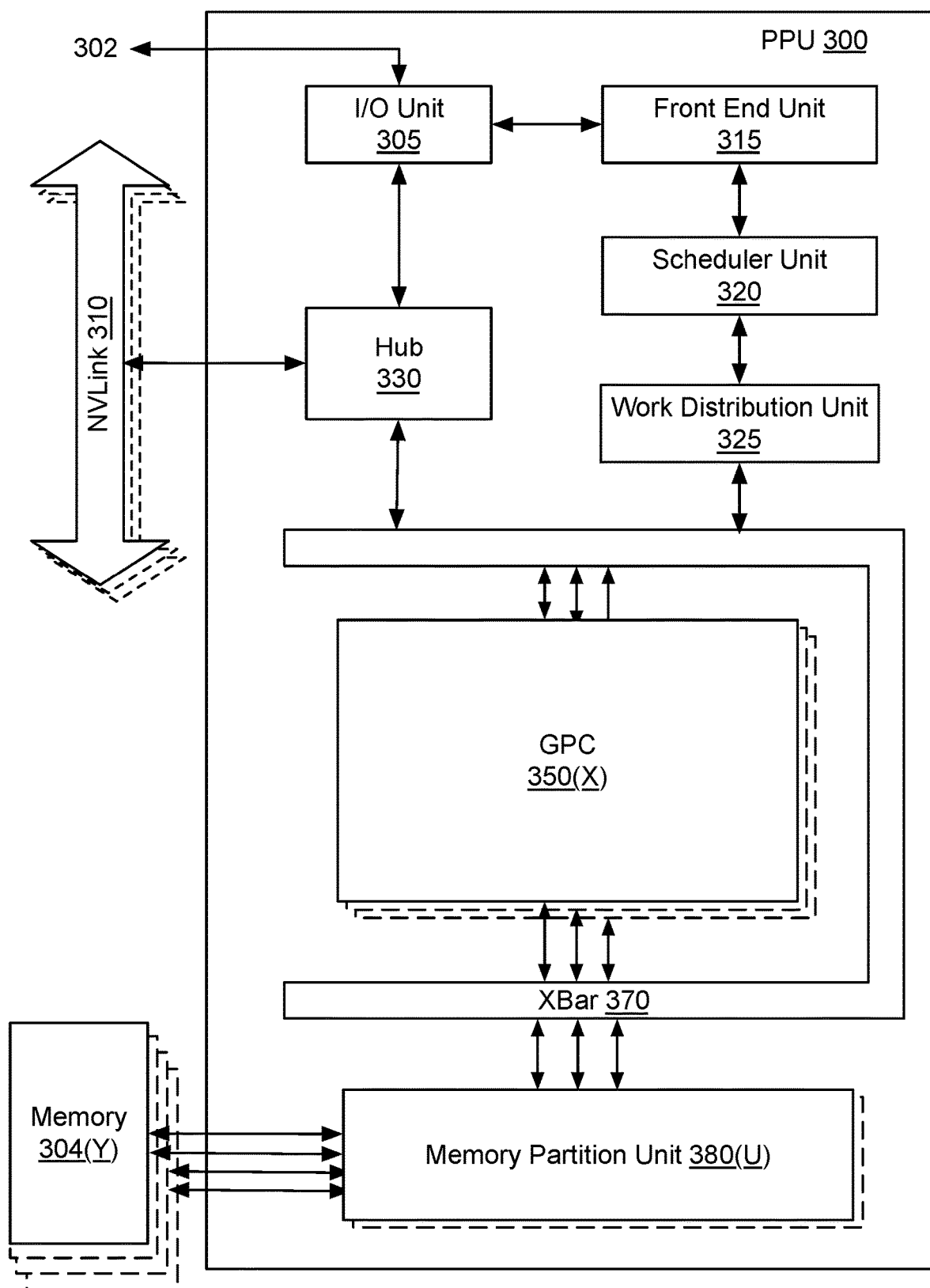
FIG. 3 illustrates an exemplary parallel processing unit.

FIG. 3 illustrates a parallel processing unit (PPU) 300, in accordance with an embodiment. In an embodiment, the PPU 300 is a multi-threaded processor that is implemented on one or more integrated circuit devices. The PPU 300 is a latency hiding architecture designed to process many threads in parallel. A thread (e.g., a thread of execution) is an instantiation of a set of instructions configured to be executed by the PPU 300. In an embodiment, the PPU 300 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the PPU 300 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more PPUs 300 may be configured to accelerate thousands of High Performance Computing (HPC), data center, and machine learning applications. The PPU 300 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 3, the PPU 300 includes an Input/Output (I/O) unit 305, a front end unit 315, a scheduler unit 320, a work distribution unit 325, a hub 330, a crossbar (Xbar) 370, one or more general processing clusters (GPCs) 350, and one or more memory partition units 380. The PPU 300 may be connected to a host processor or other PPUs 300 via one or more high-speed NVLink 310 interconnect. The PPU 300 may be connected to a host processor or other peripheral devices via an interconnect 302. The PPU 300 may also be connected to a local memory 304 comprising a number of memory devices. In an embodiment, the local memory may comprise a number of dynamic random access memory (DRAM) devices. The DRAM devices may be configured as a high-bandwidth memory (HBM) subsystem, with multiple DRAM dies stacked within each device.

The NVLink 310 interconnect enables systems to scale and include one or more PPUs 300 combined with one or more CPUs, supports cache coherence between the PPUs 300 and CPUs, and CPU mastering. Data and/or commands may be transmitted by the NVLink 310 through the hub 330 to/from other units of the PPU 300 such as one or more copy engines, a video encoder, a video decoder, a power management unit, etc. (not explicitly shown). The NVLink 310 is described in more detail in conjunction with FIG. 5B.

The I/O unit 305 is configured to transmit and receive communications (e.g., commands, data, etc.) from a host processor (not shown) over the interconnect 302. The I/O unit 305 may communicate with the host processor directly via the interconnect 302 or through one or more intermediate devices such as a memory bridge. In an embodiment, the I/O unit 305 may communicate with one or more other processors, such as one or more the PPUs 300 via the interconnect 302. In an embodiment, the I/O unit 305 implements a Peripheral Component Interconnect Express (PCIe) interface for communications over a PCIe bus and the interconnect 302 is a PCIe bus. In alternative embodiments, the I/O unit 305 may implement other types of well-known interfaces for communicating with external devices.

The I/O unit 305 decodes packets received via the interconnect 302. In an embodiment, the packets represent commands configured to cause the PPU 300 to perform various operations. The I/O unit 305 transmits the decoded commands to various other units of the PPU 300 as the commands may specify. For example, some commands may be transmitted to the front end unit 315. Other commands may be transmitted to the hub 330 or other units of the PPU 300 such as one or more copy engines, a video encoder, a video decoder, a power management unit, etc. (not explicitly shown). In other words, the I/O unit 305 is configured to route communications between and among the various logical units of the PPU 300.

In an embodiment, a program executed by the host processor encodes a command stream in a buffer that provides workloads to the PPU 300 for processing. A workload may comprise several instructions and data to be processed by those instructions. The buffer is a region in a memory that is accessible (e.g., read/write) by both the host processor and the PPU 300. For example, the I/O unit 305 may be configured to access the buffer in a system memory connected to the interconnect 302 via memory requests transmitted over the interconnect 302. In an embodiment, the host processor writes the command stream to the buffer and then transmits a pointer to the start of the command stream to the PPU 300. The front end unit 315 receives pointers to one or more command streams. The front end unit 315 manages the one or more streams, reading commands from the streams and forwarding commands to the various units of the PPU 300.

The front end unit 315 is coupled to a scheduler unit 320 that configures the various GPCs 350 to process tasks defined by the one or more streams. The scheduler unit 320 is configured to track state information related to the various tasks managed by the scheduler unit 320. The state may indicate which GPC 350 a task is assigned to, whether the task is active or inactive, a priority level associated with the task, and so forth. The scheduler unit 320 manages the execution of a plurality of tasks on the one or more GPCs 350.

The scheduler unit 320 is coupled to a work distribution unit 325 that is configured to dispatch tasks for execution on the GPCs 350. The work distribution unit 325 may track a number of scheduled tasks received from the scheduler unit 320. In an embodiment, the work distribution unit 325 manages a pending task pool and an active task pool for each of the GPCs 350. The pending task pool may comprise a number of slots (e.g., 32 slots) that contain tasks assigned to be processed by a particular GPC 350. The active task pool may comprise a number of slots (e.g., 4 slots) for tasks that are actively being processed by the GPCs 350. As a GPC 350 finishes the execution of a task, that task is evicted from the active task pool for the GPC 350 and one of the other tasks from the pending task pool is selected and scheduled for execution on the GPC 350. If an active task has been idle on the GPC 350, such as while waiting for a data dependency to be resolved, then the active task may be evicted from the GPC 350 and returned to the pending task pool while another task in the pending task pool is selected and scheduled for execution on the GPC 350.

The work distribution unit 325 communicates with the one or more GPCs 350 via XBar 370. The XBar 370 is an interconnect network that couples many of the units of the PPU 300 to other units of the PPU 300. For example, the XBar 370 may be configured to couple the work distribution unit 325 to a particular GPC 350. Although not shown explicitly, one or more other units of the PPU 300 may also be connected to the XBar 370 via the hub 330.

The tasks are managed by the scheduler unit 320 and dispatched to a GPC 350 by the work distribution unit 325. The GPC 350 is configured to process the task and generate results. The results may be consumed by other tasks within the GPC 350, routed to a different GPC 350 via the XBar 370, or stored in the memory 304. The results can be written to the memory 304 via the memory partition units 380, which implement a memory interface for reading and writing data to/from the memory 304. The results can be transmitted to another PPU 300 or CPU via the NVLink 310. In an embodiment, the PPU 300 includes a number U of memory partition units 380 that is equal to the number of separate and distinct memory devices of the memory 304 coupled to the PPU 300. A memory partition unit 380 will be described in more detail below in conjunction with FIG. 4B.

In an embodiment, a host processor executes a driver kernel that implements an API that enables one or more applications executing on the host processor to schedule operations for execution on the PPU 300. In an embodiment, multiple compute applications are simultaneously executed by the PPU 300 and the PPU 300 provides isolation, quality of service (QoS), and independent address spaces for the multiple compute applications. An application may generate instructions (e.g., API calls) that cause the driver kernel to generate one or more tasks for execution by the PPU 300. The driver kernel outputs tasks to one or more streams being processed by the PPU 300. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 5A.

Figure 4A:
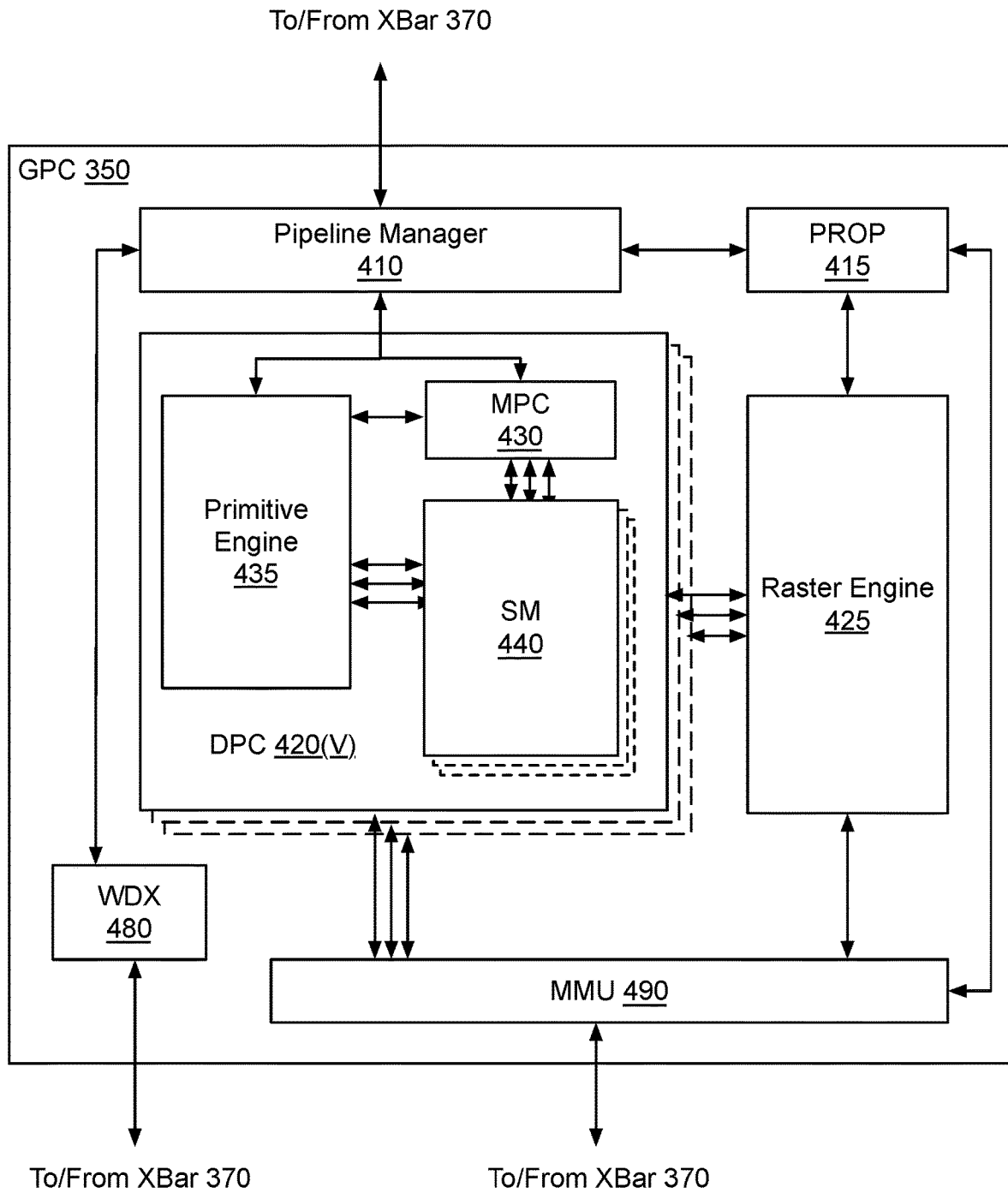
FIG. 4A illustrates an exemplary general processing cluster within the parallel processing unit of FIG. 3.

FIG. 4A illustrates a GPC 350 of the PPU 300 of FIG. 3, in accordance with an embodiment. As shown in FIG. 4A, each GPC 350 includes a number of hardware units for processing tasks. In an embodiment, each GPC 350 includes a pipeline manager 410, a pre-raster operations unit (PROP) 415, a raster engine 425, a work distribution crossbar (WDX) 480, a memory management unit (MMU) 490, and one or more Data Processing Clusters (DPCs) 420. It will be appreciated that the GPC 350 of FIG. 4A may include other hardware units in lieu of or in addition to the units shown in FIG. 4A.

In an embodiment, the operation of the GPC 350 is controlled by the pipeline manager 410. The pipeline manager 410 manages the configuration of the one or more DPCs 420 for processing tasks allocated to the GPC 350. In an embodiment, the pipeline manager 410 may configure at least one of the one or more DPCs 420 to implement at least a portion of a graphics rendering pipeline. For example, a DPC 420 may be configured to execute a vertex shader program on the programmable streaming multiprocessor (SM) 440. The pipeline manager 410 may also be configured to route packets received from the work distribution unit 325 to the appropriate logical units within the GPC 350. For example, some packets may be routed to fixed function hardware units in the PROP 415 and/or raster engine 425 while other packets may be routed to the DPCs 420 for processing by the primitive engine 435 or the SM 440. In an embodiment, the pipeline manager 410 may configure at least one of the one or more DPCs 420 to implement a neural network model and/or a computing pipeline.

Figure 4B:
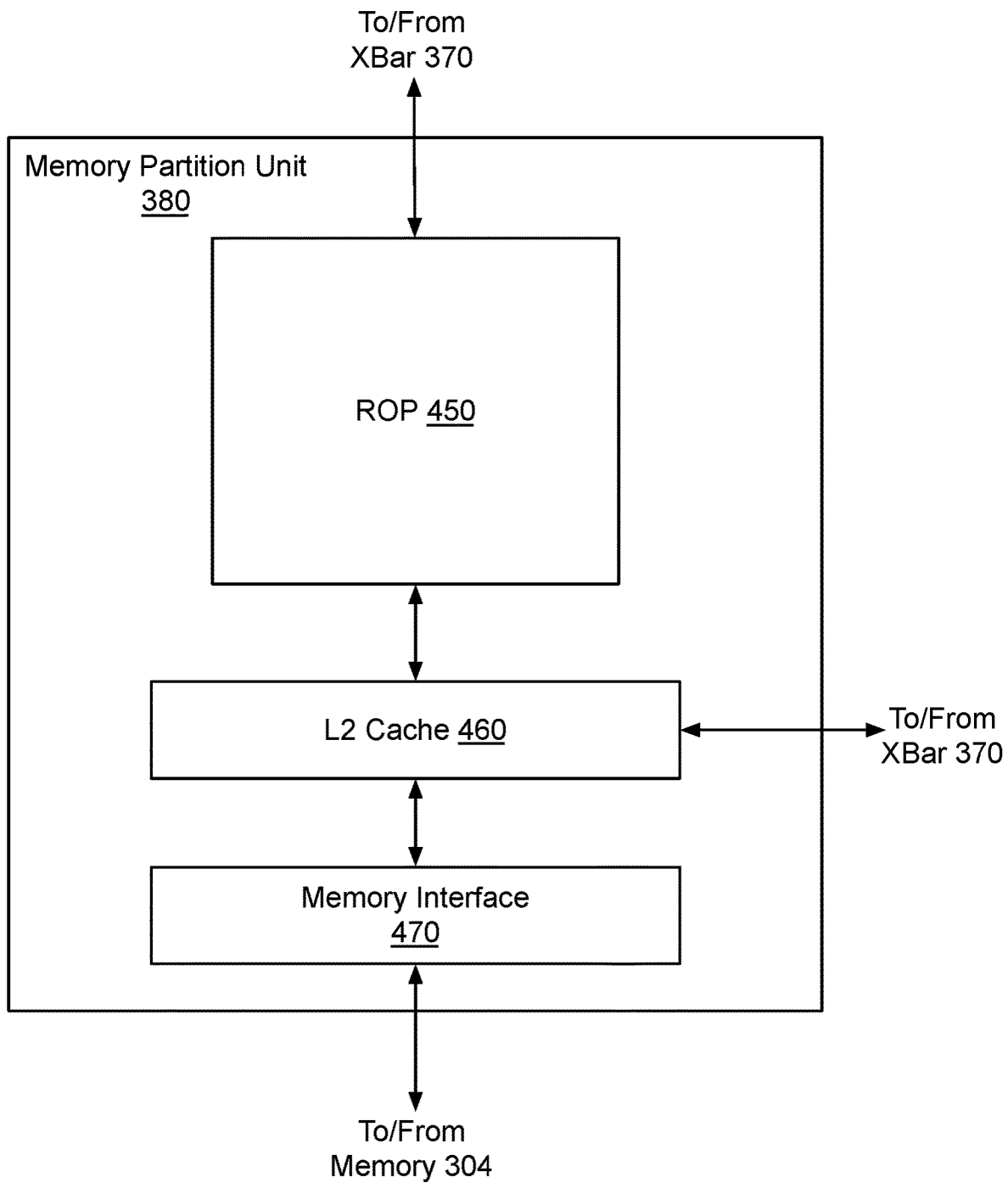
FIG. 4B illustrates an exemplary memory partition unit of the parallel processing unit of FIG. 3.

The PROP unit 415 is configured to route data generated by the raster engine 425 and the DPCs 420 to a Raster Operations (ROP) unit, described in more detail in conjunction with FIG. 4B. The PROP unit 415 may also be configured to perform optimizations for color blending, organize pixel data, perform address translations, and the like.

The raster engine 425 includes a number of fixed function hardware units configured to perform various raster operations. In an embodiment, the raster engine 425 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x,y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 425 comprises fragments to be processed, for example, by a fragment shader implemented within a DPC 420.

Each DPC 420 included in the GPC 350 includes an M-Pipe Controller (MPC) 430, a primitive engine 435, and one or more SMs 440. The MPC 430 controls the operation of the DPC 420, routing packets received from the pipeline manager 410 to the appropriate units in the DPC 420. For example, packets associated with a vertex may be routed to the primitive engine 435, which is configured to fetch vertex attributes associated with the vertex from the memory 304. In contrast, packets associated with a shader program may be transmitted to the SM 440.

The SM 440 comprises a programmable streaming processor that is configured to process tasks represented by a number of threads. Each SM 440 is multi-threaded and configured to execute a plurality of threads (e.g., 32 threads) from a particular group of threads concurrently. In an embodiment, the SM 440 implements a SIMD (Single-Instruction, Multiple-Data) architecture where each thread in a group of threads (e.g., a warp) is configured to process a different set of data based on the same set of instructions. All threads in the group of threads execute the same instructions. In another embodiment, the SM 440 implements a SIMT (Single-Instruction, Multiple Thread) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The SM 440 will be described in more detail below in conjunction with FIG. 5A.

The MMU 490 provides an interface between the GPC 350 and the memory partition unit 380. The MMU 490 may provide translation of virtual addresses into physical addresses, memory protection, and arbitration of memory requests. In an embodiment, the MMU 490 provides one or more translation lookaside buffers (TLBs) for performing translation of virtual addresses into physical addresses in the memory 304.

FIG. 4B illustrates a memory partition unit 380 of the PPU 300 of FIG. 3, in accordance with an embodiment. As shown in FIG. 4B, the memory partition unit 380 includes a Raster Operations (ROP) unit 450, a level two (L2) cache 460, and a memory interface 470. The memory interface 470 is coupled to the memory 304. Memory interface 470 may implement 32, 64, 128, 1024-bit data buses, or the like, for high-speed data transfer. In an embodiment, the PPU 300 incorporates U memory interfaces 470, one memory interface 470 per pair of memory partition units 380, where each pair of memory partition units 380 is connected to a corresponding memory device of the memory 304. For example, PPU 300 may be connected to up to Y memory devices, such as high bandwidth memory stacks or graphics double-data-rate, version 5, synchronous dynamic random access memory, or other types of persistent storage.

In an embodiment, the memory interface 470 implements an HBM2 memory interface and Y equals half U. In an embodiment, the HBM2 memory stacks are located on the same physical package as the PPU 300, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 304 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where PPUs 300 process very large datasets and/or run applications for extended periods.

In an embodiment, the PPU 300 implements a multi-level memory hierarchy. In an embodiment, the memory partition unit 380 supports a unified memory to provide a single unified virtual address space for CPU and PPU 300 memory, enabling data sharing between virtual memory systems. In an embodiment the frequency of accesses by a PPU 300 to memory located on other processors is traced to ensure that memory pages are moved to the physical memory of the PPU 300 that is accessing the pages more frequently. In an embodiment, the NVLink 310 supports address translation services allowing the PPU 300 to directly access a CPU's page tables and providing full access to CPU memory by the PPU 300.

In an embodiment, copy engines transfer data between multiple PPUs 300 or between PPUs 300 and CPUs. The copy engines can generate page faults for addresses that are not mapped into the page tables. The memory partition unit 380 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 304 or other system memory may be fetched by the memory partition unit 380 and stored in the L2 cache 460, which is located on-chip and is shared between the various GPCs 350. As shown, each memory partition unit 380 includes a portion of the L2 cache 460 associated with a corresponding memory 304. Lower level caches may then be implemented in various units within the GPCs 350. For example, each of the SMs 440 may implement a level one (L1) cache. The L1 cache is private memory that is dedicated to a particular SM 440. Data from the L2 cache 460 may be fetched and stored in each of the L1 caches for processing in the functional units of the SMs 440. The L2 cache 460 is coupled to the memory interface 470 and the XBar 370.

The ROP unit 450 performs graphics raster operations related to pixel color, such as color compression, pixel blending, and the like. The ROP unit 450 also implements depth testing in conjunction with the raster engine 425, receiving a depth for a sample location associated with a pixel fragment from the culling engine of the raster engine 425. The depth is tested against a corresponding depth in a depth buffer for a sample location associated with the fragment. If the fragment passes the depth test for the sample location, then the ROP unit 450 updates the depth buffer and transmits a result of the depth test to the raster engine 425. It will be appreciated that the number of memory partition units 380 may be different than the number of GPCs 350 and, therefore, each ROP unit 450 may be coupled to each of the GPCs 350. The ROP unit 450 tracks packets received from the different GPCs 350 and determines which GPC 350 that a result generated by the ROP unit 450 is routed to through the Xbar 370. Although the ROP unit 450 is included within the memory partition unit 380 in FIG. 4B, in other embodiment, the ROP unit 450 may be outside of the memory partition unit 380. For example, the ROP unit 450 may reside in the GPC 350 or another unit.

Figure 5A:
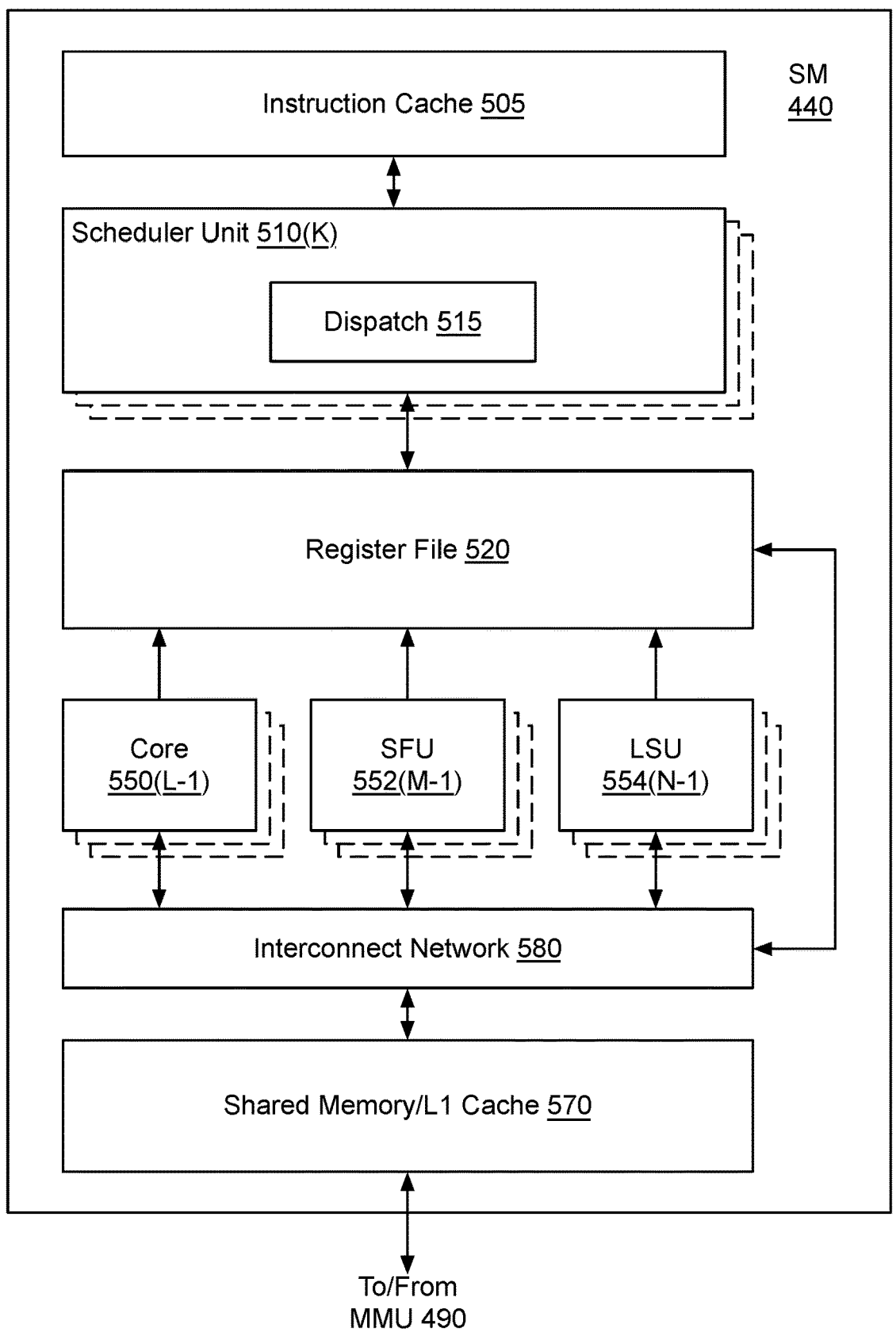
FIG. 5A illustrates an exemplary streaming multi-processor of FIG. 4A.

FIG. 5A illustrates the streaming multi-processor 440 of FIG. 4A, in accordance with an embodiment. As shown in FIG. 5A, the SM 440 includes an instruction cache 505, one or more scheduler units 510, a register file 520, one or more processing cores 550, one or more special function units (SFUs) 552, one or more load/store units (LSUs) 554, an interconnect network 580, a shared memory/L1 cache 570.

As described above, the work distribution unit 325 dispatches tasks for execution on the GPCs 350 of the PPU 300. The tasks are allocated to a particular DPC 420 within a GPC 350 and, if the task is associated with a shader program, the task may be allocated to an SM 440. The scheduler unit 510 receives the tasks from the work distribution unit 325 and manages instruction scheduling for one or more thread blocks assigned to the SM 440. The scheduler unit 510 schedules thread blocks for execution as warps of parallel threads, where each thread block is allocated at least one warp. In an embodiment, each warp executes 32 threads. The scheduler unit 510 may manage a plurality of different thread blocks, allocating the warps to the different thread blocks and then dispatching instructions from the plurality of different cooperative groups to the various functional units (e.g., cores 550, SFUs 552, and LSUs 554) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch unit 515 is configured to transmit instructions to one or more of the functional units. In the embodiment, the scheduler unit 510 includes two dispatch units 515 that enable two different instructions from the same warp to be dispatched during each clock cycle. In alternative embodiments, each scheduler unit 510 may include a single dispatch unit 515 or additional dispatch units 515.

Each SM 440 includes a register file 520 that provides a set of registers for the functional units of the SM 440. In an embodiment, the register file 520 is divided between each of the functional units such that each functional unit is allocated a dedicated portion of the register file 520. In another embodiment, the register file 520 is divided between the different warps being executed by the SM 440. The register file 520 provides temporary storage for operands connected to the data paths of the functional units.

Each SM 440 comprises L processing cores 550. In an embodiment, the SM 440 includes a large number (e.g., 128, etc.) of distinct processing cores 550. Each core 550 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the cores 550 include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the cores 550. In particular, the tensor cores are configured to perform deep learning matrix arithmetic, such as convolution operations for neural network training and inferencing. In an embodiment, each tensor core operates on a 4×4 matrix and performs a matrix multiply and accumulate operation $D=A \times B+C$, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 440 also comprises M SFUs 552 that perform special functions (e.g., attribute evaluation, reciprocal square root, and the like). In an embodiment, the SFUs 552 may include a tree traversal unit configured to traverse a hierarchical tree data structure. In an embodiment, the SFUs 552 may include texture unit configured to perform texture map filtering operations. In an embodiment, the texture units are configured to load texture maps (e.g., a 2D array of texels) from the memory 304 and sample the texture maps to produce sampled texture values for use in shader programs executed by the SM 440. In an embodiment, the texture maps are stored in the shared memory/L1 cache 570. The texture units implement texture operations such as filtering operations using mip-maps (e.g., texture maps of varying levels of detail). In an embodiment, each SM 340 includes two texture units.

Each SM 440 also comprises N LSUs 554 that implement load and store operations between the shared memory/L1 cache 570 and the register file 520. Each SM 440 includes an interconnect network 580 that connects each of the functional units to the register file 520 and the LSU 554 to the register file 520, shared memory/L1 cache 570. In an embodiment, the interconnect network 580 is a crossbar that can be configured to connect any of the functional units to any of the registers in the register file 520 and connect the LSUs 554 to the register file and memory locations in shared memory/L1 cache 570.

The shared memory/L1 cache 570 is an array of on-chip memory that allows for data storage and communication between the SM 440 and the primitive engine 435 and between threads in the SM 440. In an embodiment, the shared memory/L1 cache 570 comprises 128 KB of storage capacity and is in the path from the SM 440 to the memory partition unit 380. The shared memory/L1 cache 570 can be used to cache reads and writes. One or more of the shared memory/L1 cache 570, L2 cache 460, and memory 304 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 570 enables the shared memory/L1 cache 570 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 3, are bypassed, creating a much simpler programming model. In the general purpose parallel computation configuration, the work distribution unit 325 assigns and distributes blocks of threads directly to the DPCs 420. The threads in a block execute the same program, using a unique thread ID in the calculation to ensure each thread generates unique results, using the SM 440 to execute the program and perform calculations, shared memory/L1 cache 570 to communicate between threads, and the LSU 554 to read and write global memory through the shared memory/L1 cache 570 and the memory partition unit 380. When configured for general purpose parallel computation, the SM 440 can also write commands that the scheduler unit 320 can use to launch new work on the DPCs 420.

The PPU 300 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like.

In an embodiment, the PPU 300 is embodied on a single semiconductor substrate. In another embodiment, the PPU 300 is included in a system-on-a-chip (SoC) along with one or more other devices such as additional PPUs 300, the memory 304, a reduced instruction set computer (RISC) CPU, a memory management unit (MMU), a digital-to-analog converter (DAC), and the like.

In an embodiment, the PPU 300 may be included on a graphics card that includes one or more memory devices. The graphics card may be configured to interface with a PCIe slot on a motherboard of a desktop computer. In yet another embodiment, the PPU 300 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 5B:
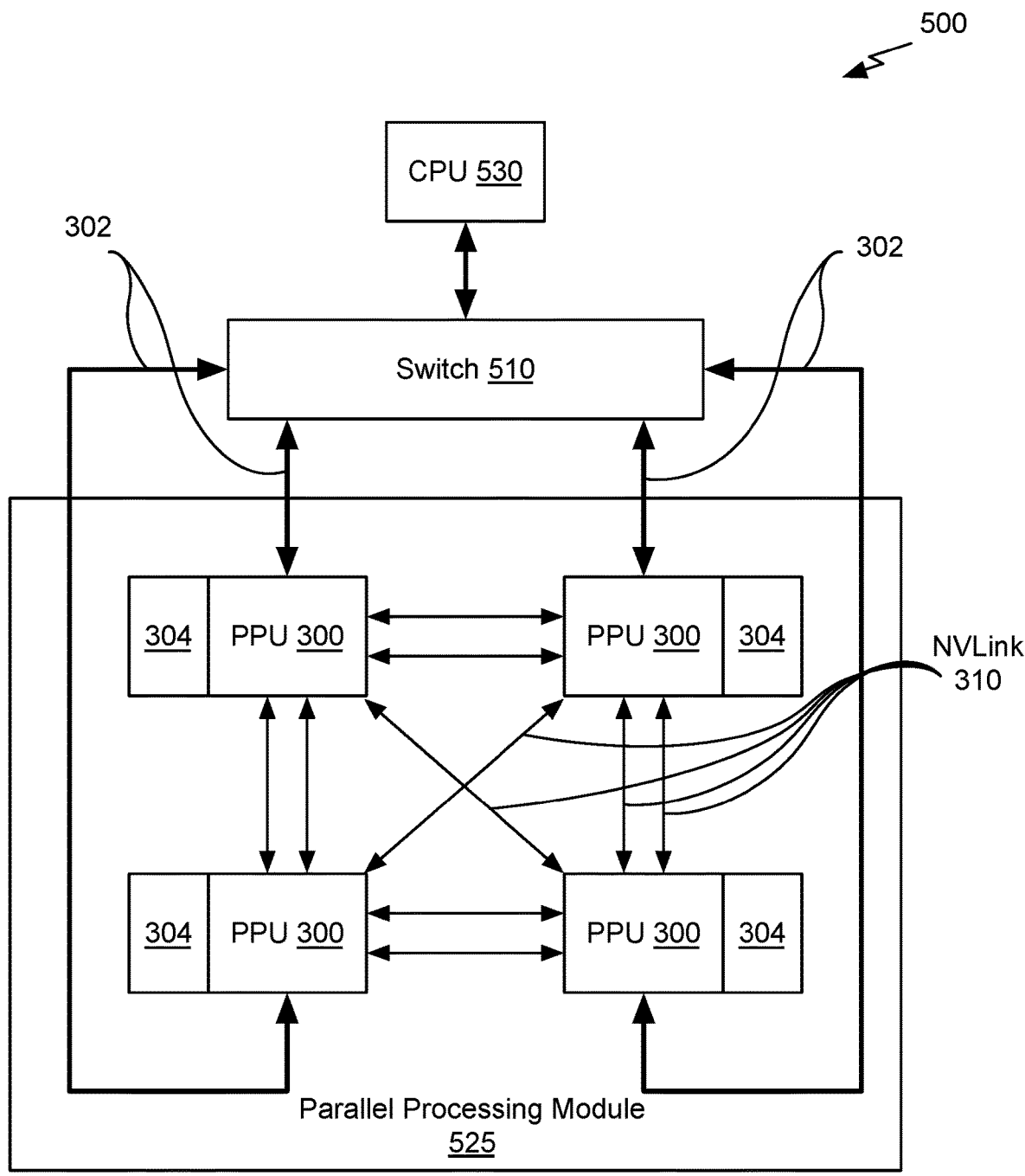
FIG. 5B illustrates an exemplary diagram of a processing system implemented using the PPU of FIG. 3, in accordance with an embodiment.

FIG. 5B is a conceptual diagram of a processing system 500 implemented using the PPU 300 of FIG. 3, in accordance with an embodiment. The exemplary system 565 may be configured to implement the method 130 shown in FIG. 1D, the method 150 shown in FIG. 1E, and/or the method 200 shown in FIG. 2B. The processing system 500 includes a CPU 530, switch 510, and multiple PPUs 300, and respective memories 304. The NVLink 310 provides high-speed communication links between each of the PPUs 300. Although a particular number of NVLink 310 and interconnect 302 connections are illustrated in FIG. 5B, the number of connections to each PPU 300 and the CPU 530 may vary. The switch 510 interfaces between the interconnect 302 and the CPU 530. The PPUs 300, memories 304, and NVLinks 310 may be situated on a single semiconductor platform to form a parallel processing module 525. In an embodiment, the switch 510 supports two or more protocols to interface between various different connections and/or links.

In another embodiment (not shown), the NVLink 310 provides one or more high-speed communication links between each of the PPUs 300 and the CPU 530 and the switch 510 interfaces between the interconnect 302 and each of the PPUs 300. The PPUs 300, memories 304, and interconnect 302 may be situated on a single semiconductor platform to form a parallel processing module 525. In yet another embodiment (not shown), the interconnect 302 provides one or more communication links between each of the PPUs 300 and the CPU 530 and the switch 510 interfaces between each of the PPUs 300 using the NVLink 310 to provide one or more high-speed communication links between the PPUs 300. In another embodiment (not shown), the NVLink 310 provides one or more high-speed communication links between the PPUs 300 and the CPU 530 through the switch 510. In yet another embodiment (not shown), the interconnect 302 provides one or more communication links between each of the PPUs 300 directly. One or more of the NVLink 310 high-speed communication links may be implemented as a physical NVLink interconnect or either an on-chip or on-die interconnect using the same protocol as the NVLink 310.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 525 may be implemented as a circuit board substrate and each of the PPUs 300 and/or memories 304 may be packaged devices. In an embodiment, the CPU 530, switch 510, and the parallel processing module 525 are situated on a single semiconductor platform.

In an embodiment, the signaling rate of each NVLink 310 is 20 to 25 Gigabits/second and each PPU 300 includes six NVLink 310 interfaces (as shown in FIG. 5B, five NVLink 310 interfaces are included for each PPU 300). Each NVLink 310 provides a data transfer rate of 25 Gigabytes/second in each direction, with six links providing 300 Gigabytes/second. The NVLinks 310 can be used exclusively for PPU-to-PPU communication as shown in FIG. 5B, or some combination of PPU-to-PPU and PPU-to-CPU, when the CPU 530 also includes one or more NVLink 310 interfaces.

In an embodiment, the NVLink 310 allows direct load/store/atomic access from the CPU 530 to each PPU's 300 memory 304. In an embodiment, the NVLink 310 supports coherency operations, allowing data read from the memories 304 to be stored in the cache hierarchy of the CPU 530, reducing cache access latency for the CPU 530. In an embodiment, the NVLink 310 includes support for Address Translation Services (ATS), allowing the PPU 300 to directly access page tables within the CPU 530. One or more of the NVLinks 310 may also be configured to operate in a low-power mode.

Figure 5C:
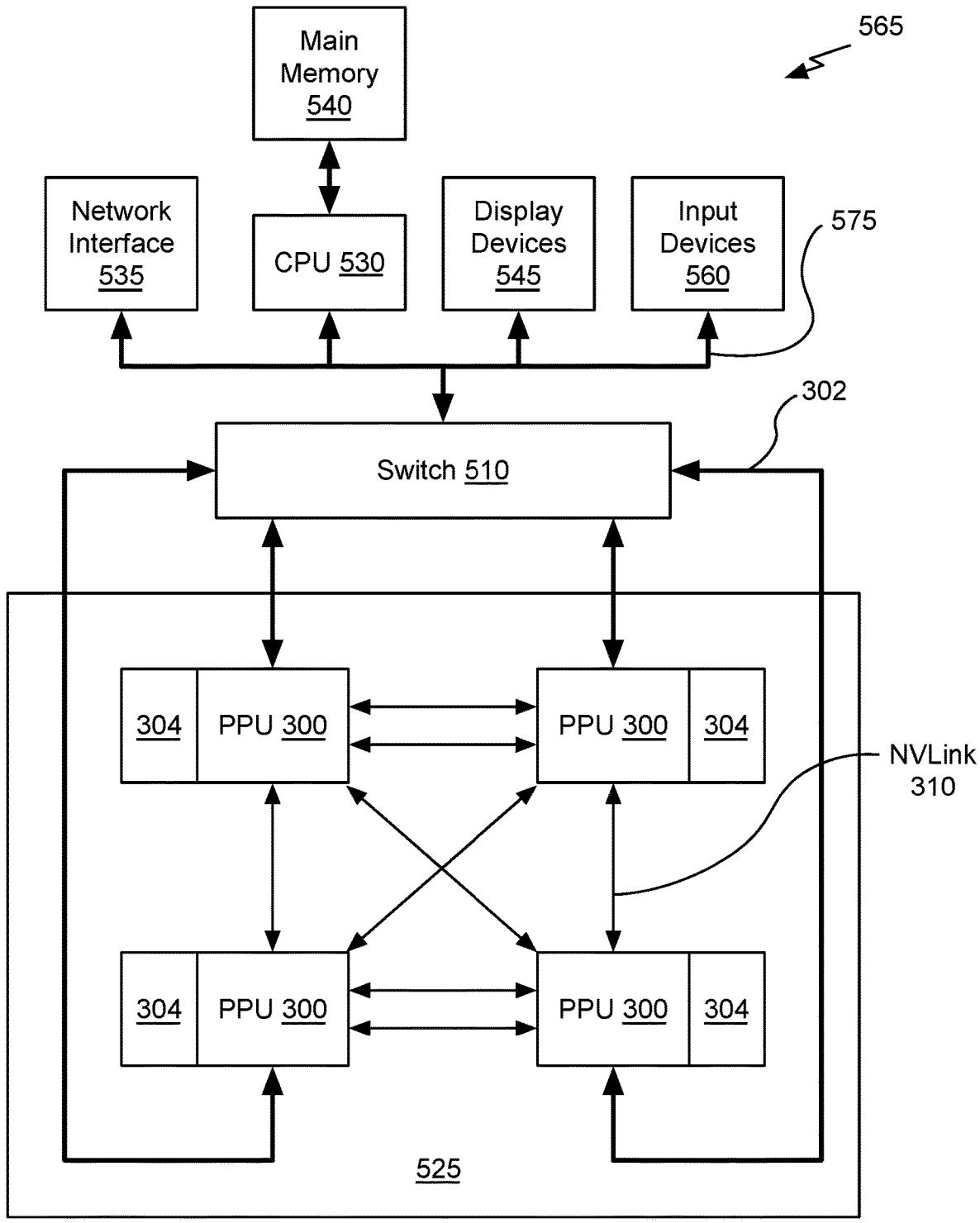
FIG. 5C illustrates an exemplary system in which the various architecture and/or functionality of the various embodiments of the present disclosure may be implemented.

FIG. 5C illustrates an exemplary system 565 in which the various architecture and/or functionality of the various previous embodiments may be implemented. The exemplary system 565 may be configured to implement the method 130 shown in FIG. 1D, the method 150 shown in FIG. 1E, and/or the method 200 shown in FIG. 2B.

As shown, a system 565 is provided including at least one central processing unit 530 that is connected to a communication bus 575. The communication bus 575 may be implemented using any suitable protocol, such as PCI (Peripheral Component Interconnect), PCI-Express, AGP (Accelerated Graphics Port), HyperTransport, or any other bus or point-to-point communication protocol(s). The system 565 also includes a main memory 540. Control logic (software) and data are stored in the main memory 540 which may take the form of random access memory (RAM).

The system 565 also includes input devices 560, the parallel processing system 525, and display devices 545, e.g. a conventional CRT (cathode ray tube), LCD (liquid crystal display), LED (light emitting diode), plasma display or the like. User input may be received from the input devices 560, e.g., keyboard, mouse, touchpad, microphone, and the like. Each of the foregoing modules and/or devices may even be situated on a single semiconductor platform to form the system 565. Alternately, the various modules may also be situated separately or in various combinations of semiconductor platforms per the desires of the user.

Further, the system 565 may be coupled to a network (e.g., a telecommunications network, local area network (LAN), wireless network, wide area network (WAN) such as the Internet, peer-to-peer network, cable network, or the like) through a network interface 535 for communication purposes.

The system 565 may also include a secondary storage (not shown). The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 540 and/or the secondary storage. Such computer programs, when executed, enable the system 565 to perform various functions. The memory 540, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the system 565 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

In an embodiment, the PPU 300 comprises a graphics processing unit (GPU). The PPU 300 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 300 can be configured to process the graphics primitives to generate a frame buffer (e.g., pixel data for each of the pixels of the display).

An application writes model data for a scene (e.g., a collection of vertices and attributes) to a memory such as a system memory or memory 304. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the SMs 440 of the PPU 300 including one or more of a vertex shader, hull shader, domain shader, geometry shader, and a pixel shader. For example, one or more of the SMs 440 may be configured to execute a vertex shader program that processes a number of vertices defined by the model data. In an embodiment, the different SMs 440 may be configured to execute different shader programs concurrently. For example, a first subset of SMs 440 may be configured to execute a vertex shader program while a second subset of SMs 440 may be configured to execute a pixel shader program. The first subset of SMs 440 processes vertex data to produce processed vertex data and writes the processed vertex data to the L2 cache 460 and/or the memory 304. After the processed vertex data is rasterized (e.g., transformed from three-dimensional data into two-dimensional data in screen space) to produce fragment data, the second subset of SMs 440 executes a pixel shader to produce processed fragment data, which is then blended with other processed fragment data and written to the frame buffer in memory 304. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

Figure 6:
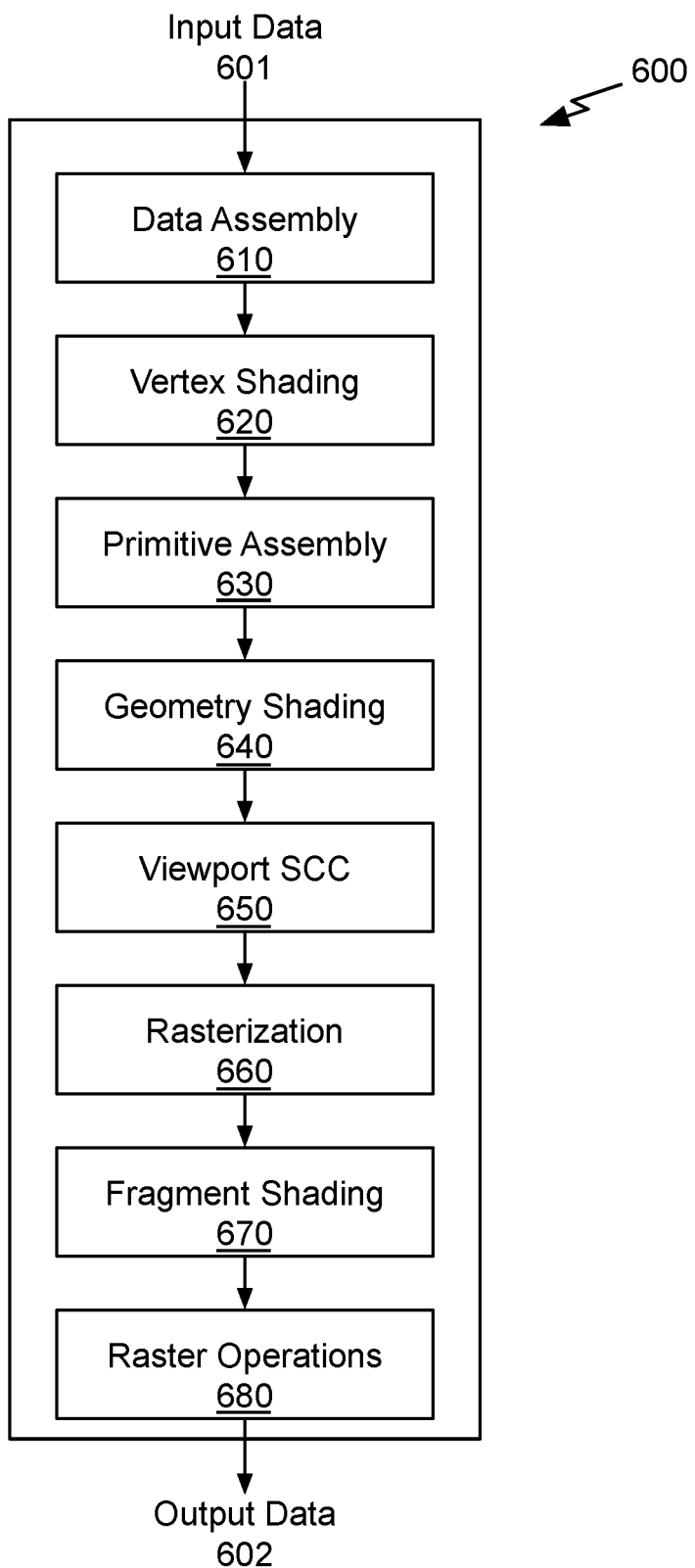
FIG. 6 illustrates an exemplary diagram of a graphics processing pipeline implemented by the PPU of FIG. 3.

FIG. 6 is a conceptual diagram of a graphics processing pipeline 600 implemented by the PPU 300 of FIG. 3, in accordance with an embodiment. The graphics processing pipeline 600 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 600 receives input data 601 that is transmitted from one stage to the next stage of the graphics processing pipeline 600 to generate output data 602. In an embodiment, the graphics processing pipeline 600 may represent a graphics processing pipeline defined by the OpenGL® API. As an option, the graphics processing pipeline 600 may be implemented in the context of the functionality and architecture of the previous Figures and/or any subsequent Figure(s).

As shown in FIG. 6, the graphics processing pipeline 600 comprises a pipeline architecture that includes a number of stages. The stages include, but are not limited to, a data assembly stage 610, a vertex shading stage 620, a primitive assembly stage 630, a geometry shading stage 640, a viewport scale, cull, and clip (VSCC) stage 650, a rasterization stage 660, a fragment shading stage 670, and a raster operations stage 680. In an embodiment, the input data 601 comprises commands that configure the processing units to implement the stages of the graphics processing pipeline 600 and geometric primitives (e.g., points, lines, triangles, quads, triangle strips or fans, etc.) to be processed by the stages. The output data 602 may comprise pixel data (e.g., color data) that is copied into a frame buffer or other type of surface data structure in a memory.

The data assembly stage 610 receives the input data 601 that specifies vertex data for high-order surfaces, primitives, or the like. The data assembly stage 610 collects the vertex data in a temporary storage or queue, such as by receiving a command from the host processor that includes a pointer to a buffer in memory and reading the vertex data from the buffer. The vertex data is then transmitted to the vertex shading stage 620 for processing.

The vertex shading stage 620 processes vertex data by performing a set of operations (e.g., a vertex shader or a program) once for each of the vertices. Vertices may be, e.g., specified as a 4-coordinate vector (e.g., <x, y, z, w>) associated with one or more vertex attributes (e.g., color, texture coordinates, surface normal, etc.). The vertex shading stage 620 may manipulate individual vertex attributes such as position, color, texture coordinates, and the like. In other words, the vertex shading stage 620 performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading stage 620 generates transformed vertex data that is transmitted to the primitive assembly stage 630.

The primitive assembly stage 630 collects vertices output by the vertex shading stage 620 and groups the vertices into geometric primitives for processing by the geometry shading stage 640. For example, the primitive assembly stage 630 may be configured to group every three consecutive vertices as a geometric primitive (e.g., a triangle) for transmission to the geometry shading stage 640. In some embodiments, specific vertices may be reused for consecutive geometric primitives (e.g., two consecutive triangles in a triangle strip may share two vertices). The primitive assembly stage 630 transmits geometric primitives (e.g., a collection of associated vertices) to the geometry shading stage 640.

The geometry shading stage 640 processes geometric primitives by performing a set of operations (e.g., a geometry shader or program) on the geometric primitives. Tessellation operations may generate one or more geometric primitives from each geometric primitive. In other words, the geometry shading stage 640 may subdivide each geometric primitive into a finer mesh of two or more geometric primitives for processing by the rest of the graphics processing pipeline 600. The geometry shading stage 640 transmits geometric primitives to the viewport SCC stage 650.

In an embodiment, the graphics processing pipeline 600 may operate within a streaming multiprocessor and the vertex shading stage 620, the primitive assembly stage 630, the geometry shading stage 640, the fragment shading stage 670, and/or hardware/software associated therewith, may sequentially perform processing operations. Once the sequential processing operations are complete, in an embodiment, the viewport SCC stage 650 may utilize the data. In an embodiment, primitive data processed by one or more of the stages in the graphics processing pipeline 600 may be written to a cache (e.g. L1 cache, a vertex cache, etc.). In this case, in an embodiment, the viewport SCC stage 650 may access the data in the cache. In an embodiment, the viewport SCC stage 650 and the rasterization stage 660 are implemented as fixed function circuitry.

The viewport SCC stage 650 performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization stage 660.

The rasterization stage 660 converts the 3D geometric primitives into 2D fragments (e.g. capable of being utilized for display, etc.). The rasterization stage 660 may be configured to utilize the vertices of the geometric primitives to setup a set of plane equations from which various attributes can be interpolated. The rasterization stage 660 may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization stage 660 generates fragment data (e.g., interpolated vertex attributes associated with a particular sample location for each covered pixel) that are transmitted to the fragment shading stage 670.

The fragment shading stage 670 processes fragment data by performing a set of operations (e.g., a fragment shader or a program) on each of the fragments. The fragment shading stage 670 may generate pixel data (e.g., color values) for the fragment such as by performing lighting operations or sampling texture maps using interpolated texture coordinates for the fragment. The fragment shading stage 670 generates pixel data that is transmitted to the raster operations stage 680.

The raster operations stage 680 may perform various operations on the pixel data such as performing alpha tests, stencil tests, and blending the pixel data with other pixel data corresponding to other fragments associated with the pixel. When the raster operations stage 680 has finished processing the pixel data (e.g., the output data 602), the pixel data may be written to a render target such as a frame buffer, a color buffer, or the like.

It will be appreciated that one or more additional stages may be included in the graphics processing pipeline 600 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading stage 640). Other types of graphics processing pipelines are contemplated as being within the scope of the present disclosure. Furthermore, any of the stages of the graphics processing pipeline 600 may be implemented by one or more dedicated hardware units within a graphics processor such as PPU 300. Other stages of the graphics processing pipeline 600 may be implemented by programmable hardware units such as the SM 440 of the PPU 300.

The graphics processing pipeline 600 may be implemented via an application executed by a host processor, such as a CPU. In an embodiment, a device driver may implement an API that defines various functions that can be utilized by an application in order to generate graphical data for display. The device driver is a software program that includes a plurality of instructions that control the operation of the PPU 300. The API provides an abstraction for a programmer that lets a programmer utilize specialized graphics hardware, such as the PPU 300, to generate the graphical data without requiring the programmer to utilize the specific instruction set for the PPU 300. The application may include an API call that is routed to the device driver for the PPU 300. The device driver interprets the API call and performs various operations to respond to the API call. In some instances, the device driver may perform operations by executing instructions on the CPU. In other instances, the device driver may perform operations, at least in part, by launching operations on the PPU 300 utilizing an input/output interface between the CPU and the PPU 300. In an embodiment, the device driver is configured to implement the graphics processing pipeline 600 utilizing the hardware of the PPU 300.

Various programs may be executed within the PPU 300 in order to implement the various stages of the graphics processing pipeline 600. For example, the device driver may launch a kernel on the PPU 300 to perform the vertex shading stage 620 on one SM 440 (or multiple SMs 440). The device driver (or the initial kernel executed by the PPU 400) may also launch other kernels on the PPU 400 to perform other stages of the graphics processing pipeline 600, such as the geometry shading stage 640 and the fragment shading stage 670. In addition, some of the stages of the graphics processing pipeline 600 may be implemented on fixed unit hardware such as a rasterizer or a data assembler implemented within the PPU 400. It will be appreciated that results from one kernel may be processed by one or more intervening fixed function hardware units before being processed by a subsequent kernel on an SM 440.

Machine Learning

Deep neural networks (DNNs) developed on processors, such as the PPU 300 have been used for diverse use cases, from self-driving cars to faster drug development, from automatic image captioning in online image databases to smart real-time language translation in video chat applications. Deep learning is a technique that models the neural learning process of the human brain, continually learning, continually getting smarter, and delivering more accurate results more quickly over time. A child is initially taught by an adult to correctly identify and classify various shapes, eventually being able to identify shapes without any coaching. Similarly, a deep learning or neural learning system needs to be trained in object recognition and classification for it get smarter and more efficient at identifying basic objects, occluded objects, etc., while also assigning context to objects.

At the simplest level, neurons in the human brain look at various inputs that are received, importance levels are assigned to each of these inputs, and output is passed on to other neurons to act upon. An artificial neuron or perceptron is the most basic model of a neural network. In one example, a perceptron may receive one or more inputs that represent various features of an object that the perceptron is being trained to recognize and classify, and each of these features is assigned a certain weight based on the importance of that feature in defining the shape of an object.

A deep neural network (DNN) model includes multiple layers of many connected nodes (e.g., perceptrons, Boltzmann machines, radial basis functions, convolutional layers, etc.) that can be trained with enormous amounts of input data to quickly solve complex problems with high accuracy. In one example, a first layer of the DNN model breaks down an input image of an automobile into various sections and looks for basic patterns such as lines and angles. The second layer assembles the lines to look for higher level patterns such as wheels, windshields, and mirrors. The next layer identifies the type of vehicle, and the final few layers generate a label for the input image, identifying the model of a specific automobile brand.

Once the DNN is trained, the DNN can be deployed and used to identify and classify objects or patterns in a process known as inference. Examples of inference (the process through which a DNN extracts useful information from a given input) include identifying handwritten numbers on checks deposited into ATM machines, identifying images of friends in photos, delivering movie recommendations to over fifty million users, identifying and classifying different types of automobiles, pedestrians, and road hazards in driverless cars, or translating human speech in real-time.

During training, data flows through the DNN in a forward propagation phase until a prediction is produced that indicates a label corresponding to the input. If the neural network does not correctly label the input, then errors between the correct label and the predicted label are analyzed, and the weights are adjusted for each feature during a backward propagation phase until the DNN correctly labels the input and other inputs in a training dataset. Training complex neural networks requires massive amounts of parallel computing performance, including floating-point multiplications and additions that are supported by the PPU 300. Inferencing is less compute-intensive than training, being a latency-sensitive process where a trained neural network is applied to new inputs it has not seen before to classify images, translate speech, and generally infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 300 is a computing platform capable of delivering performance required for deep neural network-based artificial intelligence and machine learning applications.

It is noted that the techniques described herein may be embodied in executable instructions stored in a computer readable medium for use by or in connection with a processor-based instruction execution machine, system, apparatus, or device. It will be appreciated by those skilled in the art that, for some embodiments, various types of computer-readable media can be included for storing data. As used herein, a "computer-readable medium" includes one or more of any suitable media for storing the executable instructions of a computer program such that the instruction execution machine, system, apparatus, or device may read (or fetch) the instructions from the computer-readable medium and execute the instructions for carrying out the described embodiments. Suitable storage formats include one or more of an electronic, magnetic, optical, and electromagnetic format. A non-exhaustive list of conventional exemplary computer-readable medium includes: a portable computer diskette; a random-access memory (RAM); a read-only memory (ROM); an erasable programmable read only memory (EPROM); a flash memory device; and optical storage devices, including a portable compact disc (CD), a portable digital video disc (DVD), and the like.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A computer-implemented method comprising:
    receiving a first value to be stored in a first granule among a plurality of granules, wherein each granule in the plurality of granules is associated with a plurality of memory locations of a memory for storing a plurality of values, and each of the plurality of granules is associated with a corresponding compression state information (CSI);
    determining that if the first value is stored in the first granule, all of the values stored in the plurality of memory locations associated with the first granule will have a uniform value;
    determining that the first value is stored in a table at a first index in the table, wherein the table holds a plurality of values, wherein each of the values in the table is associated with a unique index;
    updating a first CSI, which corresponds with the first granule, to indicate that the first granule is compressed and to indicate that all of the values of the first granule has a uniform value as the value associated with the first index in the table; and
    maintaining a tally that includes a count of granules in the plurality of granules, wherein the count is the number of granules that store a second uniform value that is not stored in the table.

2. The computer-implemented method of claim 1, wherein the first value is encoded in one, two, four, eight, or sixteen bytes.

3. The computer-implemented method of claim 1, wherein the first value represents a pixel, texel, depth, neural network weight, or neural network activation.

4. The computer-implemented method of claim 1, wherein the memory locations associated with each of the plurality of granules are contiguous.

5. The computer-implemented method of claim 1, wherein one or more of the plurality of granules is associated with a tile of a texture bitmap, wherein the texture bitmap is divided into multiple tiles.

6. The computer-implemented method of claim 1, wherein the step of determining that if the first value is stored in the first granule, all of the values stored in the plurality of memory locations associated with the first granule will have a uniform value, comprises:
    comparing the first value with other values of the first granule; and
    determining the first value and the other values are uniform.

7. The computer-implemented method of claim 1, further comprising, for each index in the table, maintaining an index count of the granules in the plurality of granules that reference the index.

8. The computer-implemented method of claim 7, further comprising replacing a second value stored in the table with the second uniform value based on the index count corresponding to the second value and the count for the second uniform value.

9. The computer-implemented method of claim 1, further comprising:
    receiving a second value to be stored in a second granule among the plurality of granules;
    determining that if the second value is stored in the second granule, all of the values stored in the plurality of memory locations associated with the second granule will have the second uniform value; and
    determining that no value in the plurality of values stored in the table equals the second uniform value.

10. The computer-implemented method of claim 9, further comprising:
    identifying a second index corresponding to an available entry in the table; and
    storing the second uniform value in the available entry.

11. The computer-implemented method of claim 9, further comprising:
    determining that no entry of the table is available;
    updating a second CSI, which corresponds with the second granule, to indicate that the second granule is not compressed; and
    storing the second value to all of the values in the second granule.

12. The computer-implemented method of claim 9, further comprising:
    determining that no entry of the table is available;
    cloning the table to produce a second table;
    splitting the plurality of granules into a first portion and a second portion, wherein the table stores uniform values only for the first portion and the second table stores uniform values only for the second portion;
    identifying a second index corresponding to an available entry in the second table; and
    storing the second uniform value in the available entry.

13. The computer-implemented method of claim 1, wherein a second granule in the plurality of granules is associated with a second table and cannot reference the table and the first granule cannot reference the second table.

14. The computer-implemented method of claim 1, wherein each granule in the plurality of granules is associated with the table.

15. A system, comprising:
a processor coupled to a memory and configured to:
receive a first value to be stored in a first granule among a plurality of granules, wherein each granule in the plurality of granules is associated with a plurality of memory locations of the memory for storing a plurality of values, and each of the plurality of granules is associated with a corresponding compression state information (CSI);
determine that if the first value is stored in the first granule, all of the values stored in the plurality of memory locations associated with the first granule will have a uniform value;
determine that the first value is stored in a table at a first index in the table, wherein the table holds a plurality of values, wherein each of the values in the table is associated with a unique index;
update a first CSI, which corresponds with the first granule, to indicate that the first granule is compressed and to indicate that all of the values of the first granule has a uniform value as the value associated with the first index in the table; and
maintain a tally that includes a count of granules in the plurality of granules, wherein the count is the number of granules that store a second uniform value that is not stored in the table.

16. The system of claim 15, wherein the processor is further configured to determine that if the first value is stored in the first granule, all of the values stored in the plurality of memory locations associated with the first granule will have a uniform value by:
comparing the first value with other values to be stored in the plurality of memory locations associated with the first granule; and
determining the first value and the other values are uniform.

17. The system of claim 15, wherein the processor is further configured to determine that if the first value is stored in the first granule, all of the values stored in the plurality of memory locations associated with the first granule will have a uniform value by:
comparing the first value with other values stored in the plurality of memory locations associated with the first granule; and
determining the first value and the other values are uniform.

18. The system of claim 15, wherein the processor is further configured to, for each index in the table, maintain an index count of the granules in the plurality of granules that reference the index.

19. A non-transitory computer-readable media storing computer instructions that, when executed by one or more processors, cause the one or more processors to perform the steps of:
receiving a first value to be stored in a first granule among a plurality of granules, wherein each granule in the plurality of granules is associated with a plurality of memory locations of a memory for storing a plurality of values, and each of the plurality of granules is associated with a corresponding compression state information (CSI);
determining that if the first value is stored in the first granule, all of the values stored in the plurality of memory locations associated with the first granule will have a uniform value;
determining that the first value is stored in a table at a first index in the table, wherein the table holds a plurality of values, wherein each of the values in the table is associated with a unique index;
updating a first CSI, which corresponds with the first granule, to indicate that the first granule is compressed and to indicate that all of the values of the first granule has a uniform value as the value associated with the first index in the table; and
maintaining a tally that includes a count of granules in the plurality of granules, wherein the count is the number of granules that store a second uniform value that is not stored in the table.

* * * * *